(12) United States Patent
Ginsberg et al.

(10) Patent No.: US 10,989,756 B2
(45) Date of Patent: Apr. 27, 2021

(54) SYSTEMS AND METHODS USING STROBOSCOPIC UNIVERSAL STRUCTURE-ENERGY FLOW CORRELATION SCATTERING MICROSCOPY

(71) Applicant: The Regents of the University of California, Oakland, CA (US)

(72) Inventors: Naomi S. Ginsberg, Berkeley, CA (US); Milan Edouard Delor, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 72 days.

(21) Appl. No.: 16/378,862

(22) Filed: Apr. 9, 2019

(65) Prior Publication Data

US 2019/0310307 A1    Oct. 10, 2019

Related U.S. Application Data

(60) Provisional application No. 62/655,222, filed on Apr. 9, 2018.

(51) Int. Cl.
| | | |
|---|---|---|
| *G01R 31/26* | (2020.01) | |
| *G01R 31/265* | (2006.01) | |
| *G02B 21/00* | (2006.01) | |
| *G02B 21/08* | (2006.01) | |
| *G02B 21/36* | (2006.01) | |
| *H01L 21/67* | (2006.01) | |
| *G02B 21/02* | (2006.01) | |

(52) U.S. Cl.
CPC ..... *G01R 31/2656* (2013.01); *G01R 31/2601* (2013.01); *G02B 21/0016* (2013.01); *G02B 21/08* (2013.01); *G02B 21/36* (2013.01); *G02B 21/02* (2013.01); *H01L 21/67288* (2013.01)

(58) Field of Classification Search
CPC ............ G01R 31/2656; G01R 31/2601; G02B 21/0016; G02B 21/08; G02B 21/36; G02B 21/02; H01L 21/67288
See application file for complete search history.

(56) References Cited

U.S. PATENT DOCUMENTS

2017/0146787 A1* 5/2017 Reed .................... G01N 23/225

\* cited by examiner

*Primary Examiner* — Clayton E. LaBalle
*Assistant Examiner* — Michael A Harrison
(74) *Attorney, Agent, or Firm* — Gavrilovich, Dodd & Lindsey LLP

(57) ABSTRACT

The disclosure provides for systems and methods which utilize an optical scattering microscope with a spatiotemporal approach to measure the nature and extent of energy flow across electronic or semiconductor materials.

15 Claims, 23 Drawing Sheets

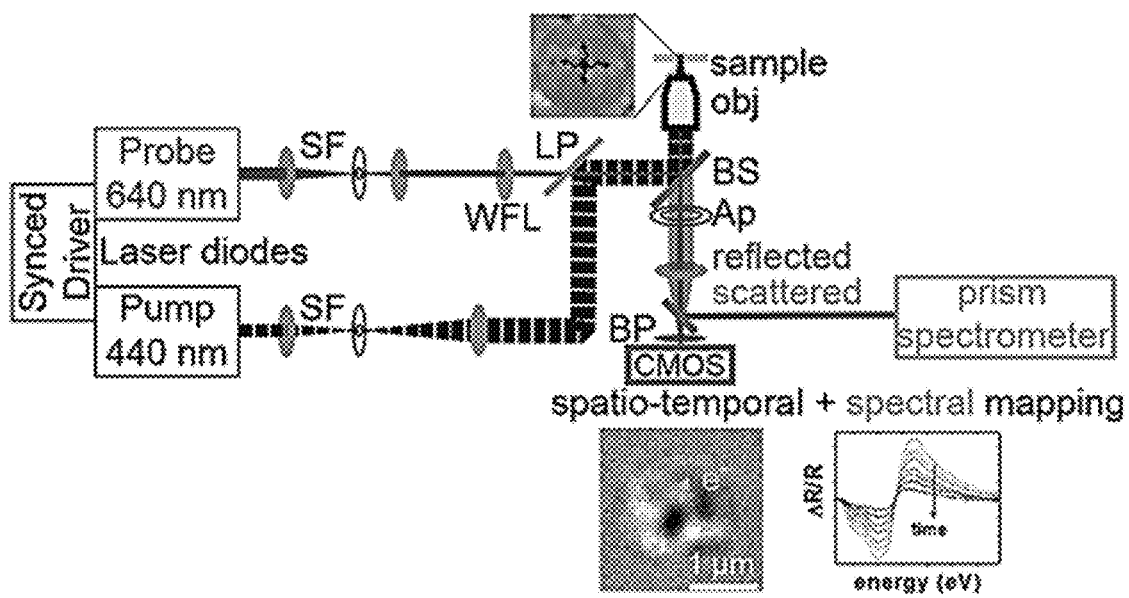
FIG. 1
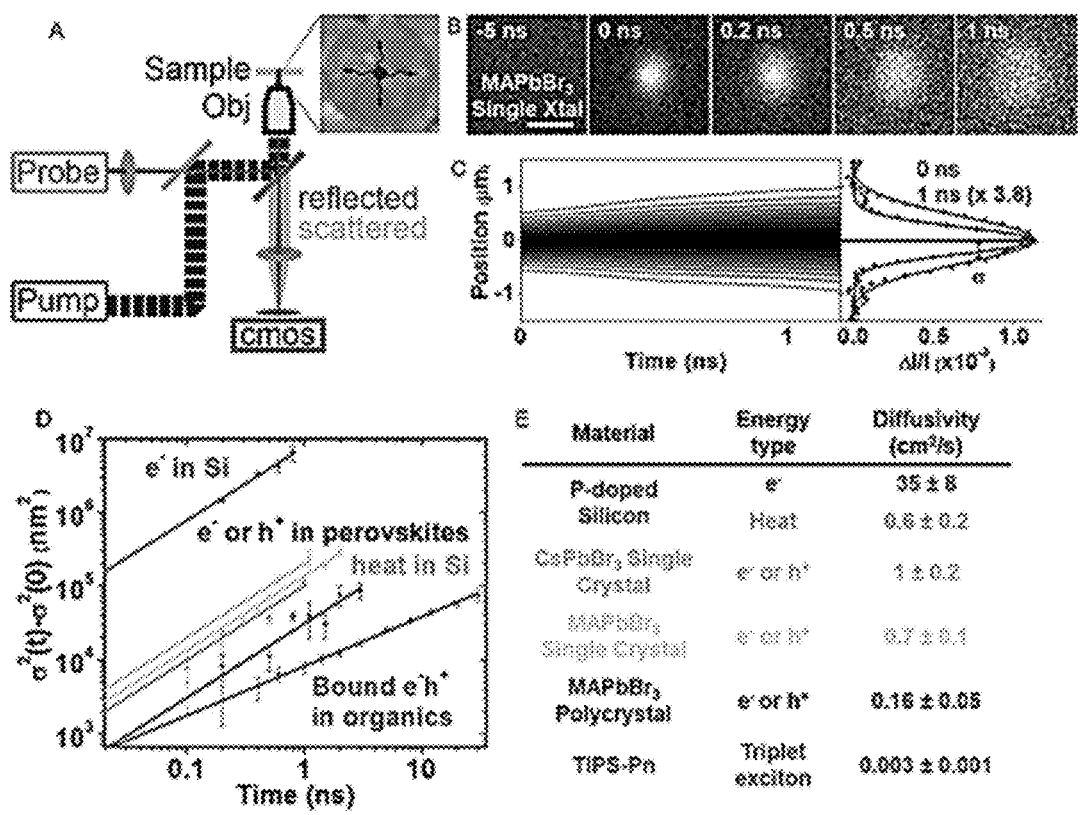
FIG. 2A-E raw fourier-filtered

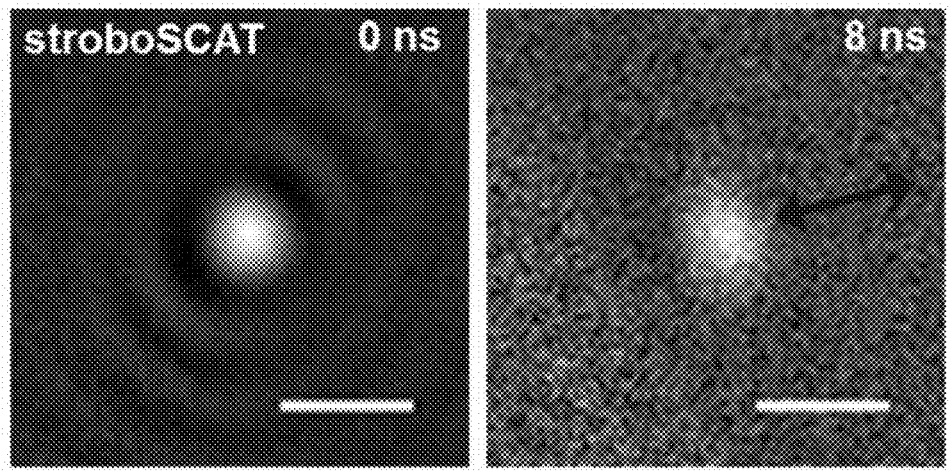
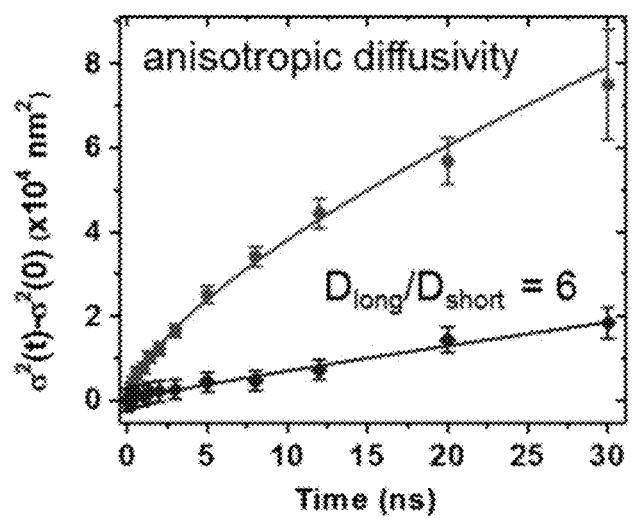
FIG. 11

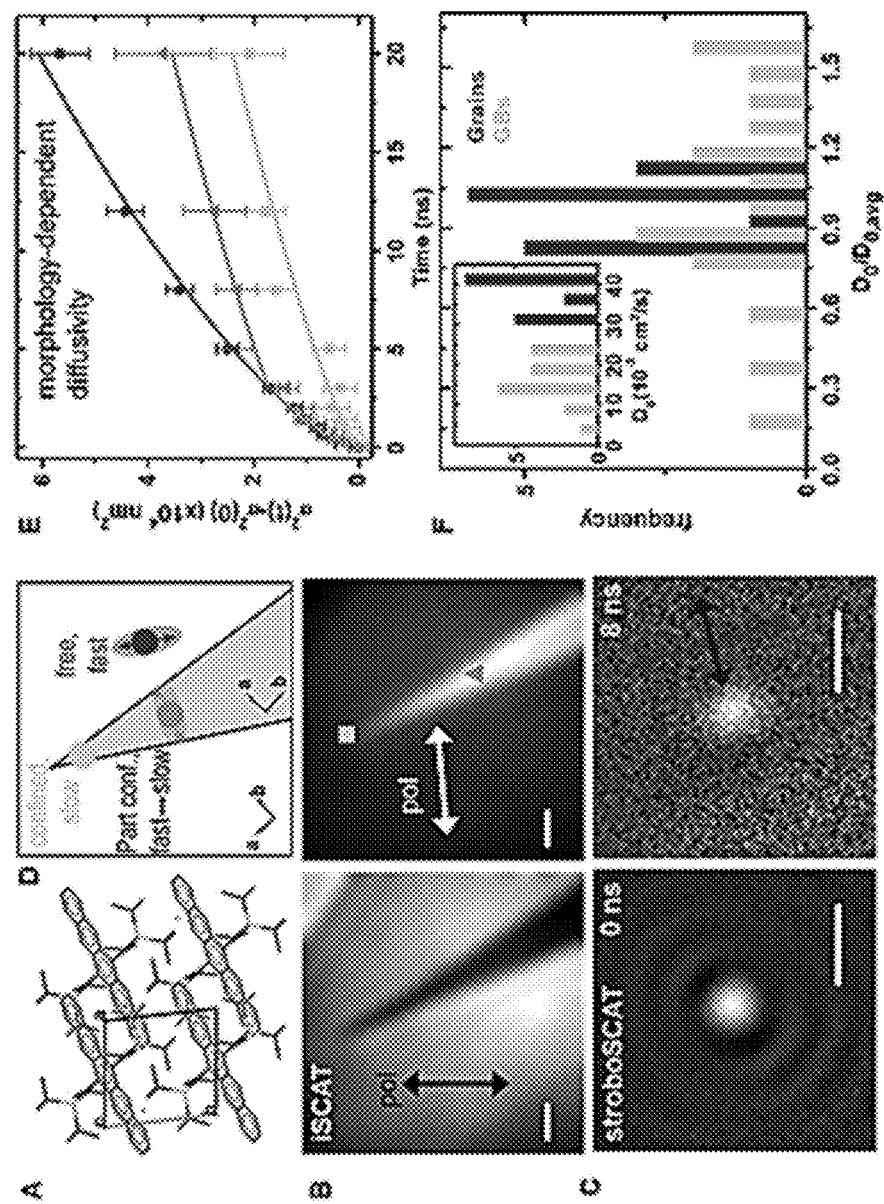
FIG. 20A-F

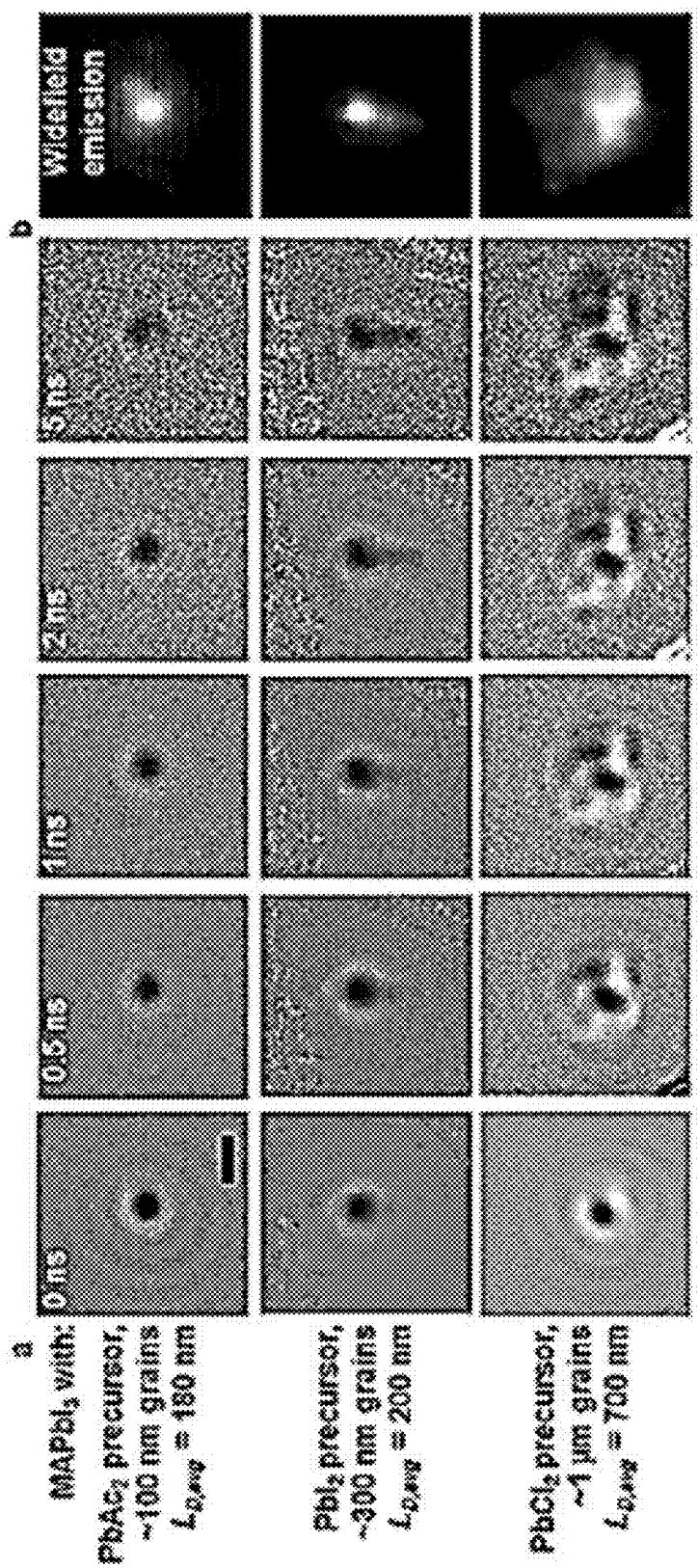
FIG. 21A-B

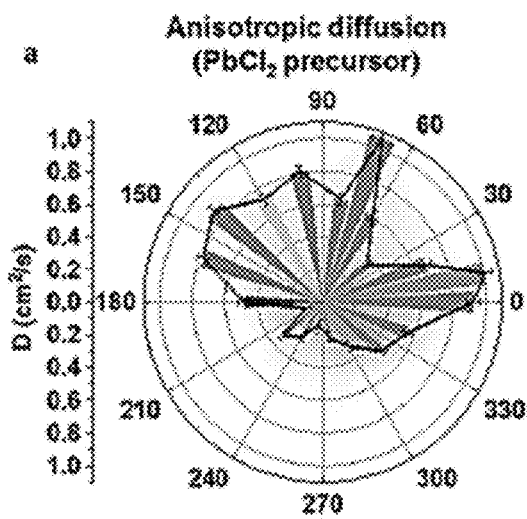 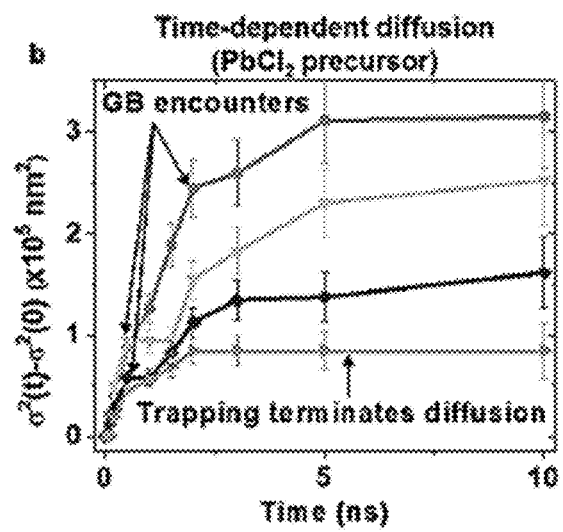
FIG. 22A    FIG. 22B
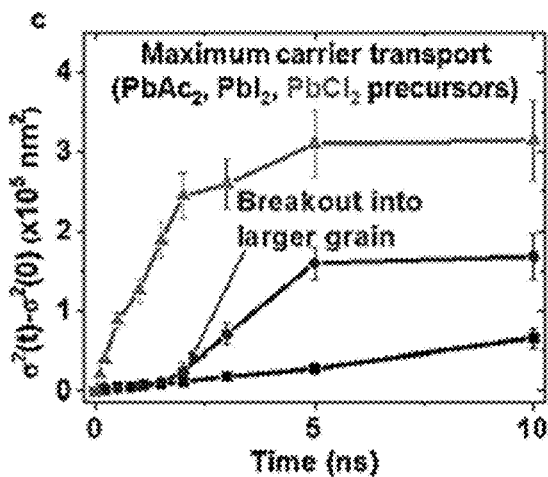 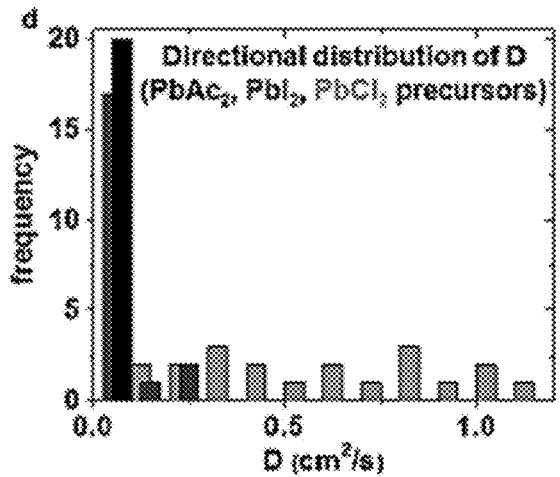
FIG. 22C    FIG. 22D

SYSTEMS AND METHODS USING STROBOSCOPIC UNIVERSAL STRUCTURE-ENERGY FLOW CORRELATION SCATTERING MICROSCOPY

CROSS REFERENCE TO RELATED APPLICATIONS

This application claims priority under 35 U.S.C. § 119 from Provisional Application Ser. No. 62/655,222, filed Apr. 9, 2018, the disclosures of which are incorporated herein by reference.

GOVERNMENT LICENSE RIGHTS

This invention was made with Government support under Grant No. 1548924 awarded by the National Science Foundation. The Government has certain rights in the invention.

TECHNICAL FIELD

The disclosure provides for systems and methods which utilize an optical scattering microscope with a spatiotemporal approach to measure the nature and extent of energy flow across electronic materials.

BACKGROUND

A greener process for making electronics is emerging whereby new, flexible semiconductor materials are printed like ink. The process is far less costly, resource- and energy-intensive than conventional silicon production. Yet, as an unintended consequence of semiconductor printing, the films produced contain structural heterogeneities, or defects, which can limit their capacity to shuttle energy, or, information, over device-relevant scales. To be able to fully embrace this new, greener process, it is important to elucidate which physical material properties most influence energy flow and which defects are most deleterious to efficient energy transport so that they can be targeted for elimination at the materials processing stage. A broadly applicable approach that non-invasively and simultaneously reveal and correlate material morphology and energy flow patterns across many scales would be especially advantageous to the developing field.

SUMMARY

The disclosure provides for an innovative high-sensitivity, non-invasive, label-free, time-resolved optical scattering microscope able to map the flow of energy in any electronic material (including, but not limited to, conductors/metals, semiconductors and insulators) in three spatial dimensions and correlate it in situ to the material morphology. Energy flow occurs over distances ranging from nanometers to microns, in the form of both free charge carriers (currents), excitons (neutral bound pairs of charge carriers), heat, and chemical species such as ions, over picosecond to millisecond time scales. While some rather complex approaches have recently been used to track energy flow, the applicability of each one, however, depends on specifics of the material properties (bandgap, excitonic vs. charge carrier form of excitation, strong absorption or emission). Existing techniques cannot therefore be applied to a broad range of materials, and often necessitate adapting samples to fit the specific requirements of the technique. In direct contrast the systems and methods disclosed herein provide a far simpler approach to spatiotemporally characterize the flow of energy in either charge, exciton, ion or heat form, irrespective of the electronic properties of the material, and with few-nm precision. The systems and methods of the disclosure provide mechanistic insights as to how local material structure affects its functionality. Furthermore, the systems and methods of the disclosure provide unprecedented capability to perform in situ correlation to the underlying physical structure of the material, enabling identification of the most deleterious defects in the studied material, which provides for targeted elimination of these defects during material formation. Thus, the systems and methods of the disclosure allows for targeted improvements to material morphology and composition, thereby improving the material's functionality.

In a particular embodiment, the disclosure provides for a stroboscopic universal structure-energy flow correlation scattering microscopy system that optically tracks an energy carrier as it moves through a material by using optical elastic scattering. In a further embodiment, the microscopy system comprises a confocal laser diode pump; a wide-field laser diode probe; an oscillator/laser driver that is used to temporally and electronically control the confocal laser diode pump and the wide-field laser diode probe; one or more spatial filters; one or more long-pass filters; an objective (lens); a light detector; optionally an aperture, and wherein the confocal laser diode pump is used to generate a localized population of energetic carriers in a material, and wherein the wide-field laser diode probe is used to generate a light pulse that interrogates the change in the spatiotemporal scattering profile of the energetic carriers induced by the first pulse. In another embodiment, the light pulse delay between the confocal pump and the wide-field probe is arbitrarily controlled between about 5 picoseconds and milliseconds (e.g., between 20 picoseconds and milliseconds). In a further embodiment, the confocal pump and the wide-field probe provide light pulses that are at different or multiple (broadband) wavelengths. In yet a further embodiment, the detector is a CMOS device. In another embodiment, the material is a solution-processed semiconductor material. Examples of semiconductor materials include, but are not limited to, lead halide perovskites, silicon and polyacene derivatives. In a certain embodiment, the disclosure further provides for a microscopy system that has one of more following features; provides non-invasive contactless probing of opaque or transparent semiconductors; provides high three dimensional spatial and temporal resolution and dynamic range; provides rapid and robust data acquisition by using wide-field detection; and/or employs less than <15-minute acquisition times. In another embodiment, the microscopy system comprises a devices and/or system as herein described.

In a particular embodiment, the disclosure provides a method to measure energy flow in an electronic material comprising: measuring the energy flow of an electronic material using a microscopy system as disclosed herein.

DESCRIPTION OF DRAWINGS

FIG. 1 presents a schematic of the stroboSCAT (stroboscopic scattering microscopy) setup. Laser diodes synchronized through a single oscillator/laser driver are used for pump and probe, using driver electronically delayed with respect to each other. After passing through spatial filters (SF) and being combined with a long-pass dichroic mirror (LP), the pump is sent collimated into the objective (obj), while the probe is focused in the back focal plane of the objective to result in a confocal and wide-field excitation spot, respectively. Light reflected from the sample-substrate interface and scattered from the sample are collected, spectrally filtered (through a longpass and bandpass filter (BP)) and focused onto a detector (CMOS). An aperture (AP) may be used to clock the scattered light and image only normally-reflected light. Also incorporated into the stroboSCAT is a parallel detection path, where instead of focusing the light into a detector, the light is sent into a spectrometer that allows spectrally-resolving the transient scattering signal. This parallel detection path is used in conjunction with a broadband probe laser. before reflecting off a 50/50 beamsplitter (BS) into the objective (obj). The pump is sent collimated into the objective while the probe is focused in the back focal plane of the objective to result in confocal and wide-field excitation spots, respectively. Light reflected from the sample-substrate interface or scattered from the sample is collected, spectrally filtered (through a long-pass and bandpass filter, BP) and focused onto a detector (CMOS). An aperture (Ap) may be used block the scattered light and image primarily normally-reflected light. Alternatively, a 3 mm beam stop can be inserted instead of Ap to block normally-reflected light and only image scattered light.

FIG. 2A-E provides examples demonstrating the transformation of iSCAT microscopy into a stroboscopic technique, where an initial short pump light pulse generates a localized population of energetic carriers in the sample, while a second large-area probe light pulse interrogates the change in the spatiotemporal scattering profile of the sample induced by the first pulse. (A) stroboSCAT setup configuration. A confocal pump (~306 nm diameter, λ=440 nm) and wide-field probe (~8 μm diameter, ~=635 nm) are overlapped on the sample plane. The pump is modulated at half the probe repetition rate, and the delay between pump and probe is controlled electronically. Probe light scattered by the sample is collected and interfered on the camera plane (CMOS) with probe light reflected at the sample-substrate interface. (B) Example dataset for $MAPbBr_3$ single crystal, showing charge carriers diffusing from an initial spot created by the pump pulse (440 nm) as a function of pump-probe time delay. The peak pump-injected carrier density is 2×1018 cm-3 and the probe is off-resonant with both ground and excited-state absorption. All stroboSCAT plots are generated by taking the difference between $pump_{on}$ and $pump_{off}$ raw images, normalized to the raw $pump_{off}$ image. Scale bar 1 μm. The distribution evolution is plotted in (C), along with the 1D Gaussian profiles extracted at 0 and 1 ns pump-probe delay, showing an initial achievable contrast on the order of $10^{-3}$ for $MAPbBr_3$ using a non-resonant probe at 640 nm and with a carrier density of ~2×10$^{18}$ cm$^{-3}$. (D) Diffusivity plots of charges, excitons or heat measured for a range of samples using exactly the same setup configuration. Note log-log axes, displaying the high dynamic range of the instrument. Error bars represent the 95% confidence intervals from Gaussian fits. All experiments are performed in a linear excitation regime, as confirmed by a lack of power dependence to extracted diffusivities. (E) Corresponding diffusivity values for the various materials studied. Quoted values and errors are means and standard deviations across multiple (~5-10) datasets across different areas of a sample and across different samples, displaying the large variability especially in heterogeneous samples, while the uncertainty for a given dataset is typically much smaller, on the order of 10% relative error except for Si where the fitting error is intrinsically higher.

FIG. 11 presents anisotropic intra-grain diffusivity in TIPS-Pentacene. Diffusivity along the long axis is approximately 6 times larger than along the short axis, as expected for anisotropic pi-stacked systems.

FIG. 20A-F illustrates stroboSCAT on TIPS-Pn. (A) crystal structure of TIPS-Pn, showing the pi-stacked axis lies between the (a and b) crystallographic axes. (B) Polarization-resolved iSCAT images of two orthogonally-oriented crystal domains. Note these images are bandpass-filtered to remove stripes arising from probe light diffraction off of interfaces (see FIG. 10). (C) stroboSCAT images at 0 and 8 ns time delay in a crystalline grain (spot in B), displaying anisotropic diffusion with six-fold faster transport along the pi-stacked axis of the crystal. (D) Schematic of exciton diffusion behavior at three different spots—intra-grain transport, highly-confined transport at GBs, and an intermediate scenario. The corresponding population expansion dynamics along the fast diffusion axes are plotted in E. The pump is circularly polarized and the probe polarization is chosen to avoid contrast bias across grains. (F) Spot-to-spot variability for initial diffusivity Do, determined from the fitting function $y=2D_0 t^\alpha$ with $\alpha$ being a free parameter, for intra-grain and GB-confined scenarios. Scale bars are all 1 µm.

FIG. 21A-D illustrates heterogeneous charge carrier transport in polycrystalline MAPbI3. (A) stroboSCAT time series on three MAPbI3 samples prepared from different precursors, and (B) corresponding wide-field emission images from confocal excitation. Grain sizes are measured using atomic force microscopy. 2D diffusion lengths LD, $=\sqrt{4D\tau}$ are azimuthally-averaged and are calculated over the first 2 ns only, during which D is approximately linear. Normalized stroboSCAT contrast is represented in greyscale with black (white) representing the most negative (positive) value. The signals do not depend on pump or probe polarization. Scale bar is 1 µm. Peak carrier density is $1.5 \times 10^{18}$ $cm^{-3}$. The probe at 640 nm is above the bandgap of MAPbI3 but is not resonant with pump-induced changes to ground or excited state absorption. (C) Representative 3D carrier paths extracted from phase-sensitive stroboSCAT images for the PbCl2 precursor film. The shading is used to indicate depth-dependent positive vs negative contrast. (D) Experimental and simulated stroboSCAT data using time-propagated finite element analysis of carrier migration along the line cut indicated by the horizontal red line in (C), showing quantitative agreement. The GB positions used in the simulation are shown in the side view of panel (C). GBs in the simulations are parametrized with depth-dependent resistivities. All simulation results are convolved with the imaging system's depth-dependent point spread function.

FIG. 22A-D provides a set of analyses that systematically quantify the degree of functional spatiotemporal heterogeneity in any sample using stroboSCAT measurements. (A) Angle-dependent diffusivities averaged over the first 2 ns for the $PbCl_2$ precursor data shown in FIG. 21A. (B) Time-dependent diffusion for four representative azimuthal angles from panel A. (C) Population expansion for the fastest- and longest-travel path for data from FIG. 21A. (D) Distribution of diffusivities over 20 radial trajectories for perovskite samples prepared from three different precursor solutions.

DETAILED DESCRIPTION

Figures 3A, 3B, 3C:
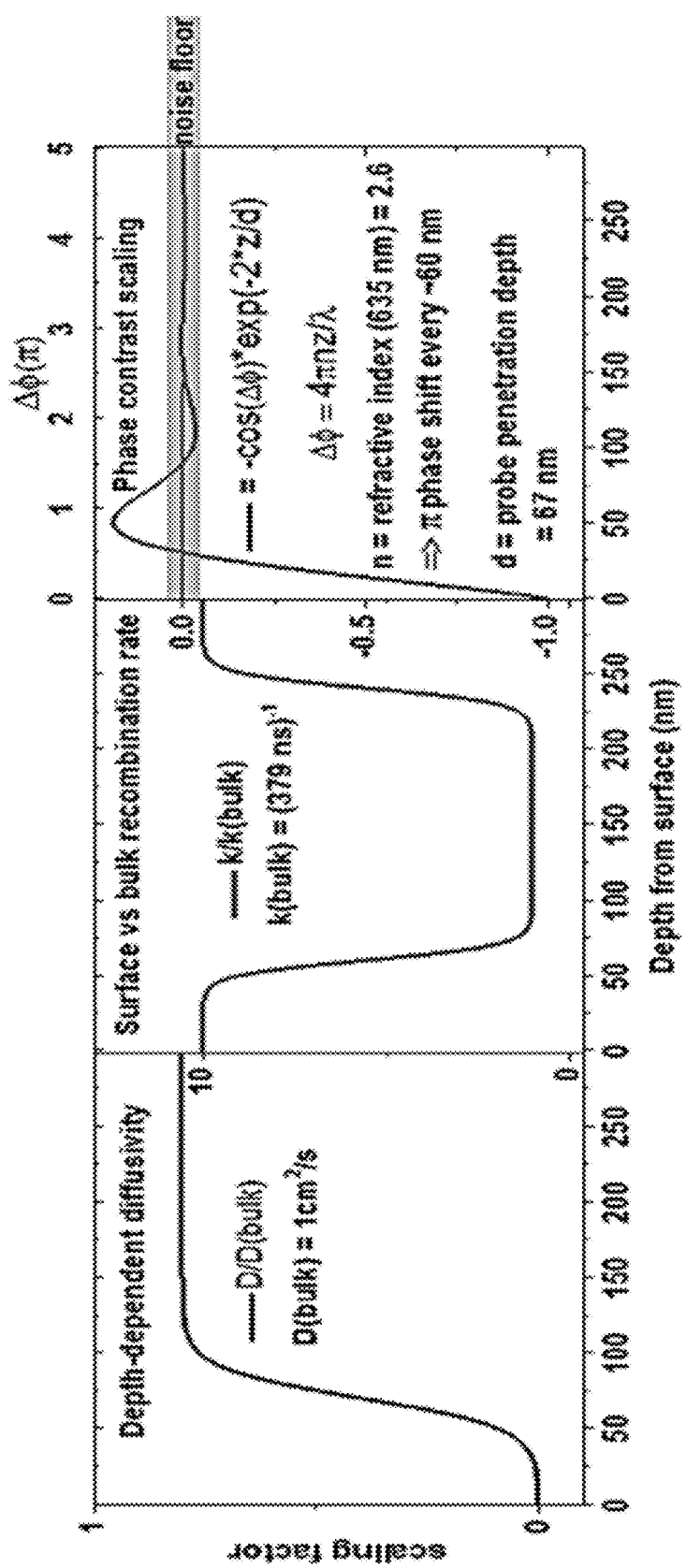
FIG. 3A-C presents depth-dependent simulation parameters: diffusivity (A), recombination rate (B), and contrast scaling due to interferometric phase sensitivity (C). The noise floor for the modeled experiments is indicated by the grey box in (C)

As used herein and in the appended claims, the singular forms "a," "an," and "the" include plural referents unless the context clearly dictates otherwise. Thus, for example, reference to a "lens" includes a plurality of lenses and reference to "an optical camera" includes reference to one or more optical cameras and equivalents thereof known to those skilled in the art, and so forth.

Unless defined otherwise, all technical and scientific terms used herein have the same meaning as commonly understood to one of ordinary skill in the art to which this disclosure belongs. Although any methods and reagents similar or equivalent to those described herein can be used in the practice of the disclosed methods and compositions, the exemplary methods and materials are now described.

All publications mentioned herein are incorporated herein by reference in full for the purpose of describing and disclosing the methodologies, which are described in the publications, which might be used in connection with the description herein. Moreover, with respect to any term that is presented in one or more publications that is similar to, or identical with, a term that has been expressly defined in this disclosure, the definition of the term as expressly provided in this disclosure will control in all respects.

Also, the use of "and" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

The ability of energy carriers to move within and between molecules lies at the heart of virtually all biochemical and material function. Yet the efforts to understand and control energy flow have been impeded by the inability to directly observe it on ultra-small and ultrafast spatiotemporal scales, where energetic and structural roadblocks often dictate the fate of energy carriers, and consequently of system function. In response, an optical instrument system has been developed herein that leverages interferometric scattering as a non-invasive, universal mechanism to track energy flow in four dimensions of space-time and directly correlate it to material morphology. A high-throughput approach has been applied to visualize exciton, carrier and heat transport in polyacene, silicon and perovskite semiconductors, displaying the broad-ranging capabilities of the systems of the disclosure. A detailed and generalized elucidation of how grain boundaries impact energy flow was a focus of the studies presented herein. The results generated therefrom reveal new ways to interpret energy transport in heterogeneous environments and suggest strategies toward defect-tolerant materials for the semiconductor industry of tomorrow.

Energy flow is a ubiquitous phenomenon, central to the function of all biological, chemical and material systems. Finding ways to control efficiency and paths of energy flow is therefore a scientific holy grail. In particular, semiconductors, at the heart of a vast majority of modern technologies-from computers to solar panels, self-driving cars to space exploration, drug discovery to medical diagnostics-most commonly rely on efficient transport of energy carriers in the form of free charges or neutral bound pairs of charges to desired targets. New and promising semiconductor materials are being developed that can be readily tuned for specific functions through chemical modifications while boasting cost-effective, low-energy processing routes. This new material diversity creates great potential for previously unimagined applications and for refining the fundamental understanding of structure-function relationships in materials-in particular how structure affects energy flow across multiple spatiotemporal scales. Nevertheless, with the advantage of chemical complexity come challenges in matching the energy flow capacity of new functional materials to those of longstanding staples in electronics—for example Silicon or III-V semiconductors—on account of concomitantly generated material heterogeneity. This heterogeneity often manifests itself as large defect, trap state and grain boundary (GB) densities, sometimes unevenly distributed through the material, as well as in a large dependence of material structure and function on processing route. Taming emerging semiconductor structure and function will therefore require the ability to characterize and evaluate samples individually and systematically in a rapid, spatially-resolved fashion that can correlate local structure to energy flow. Provided herein is a new high-throughput and universal approach to directly track energy flow across a vast dynamic range in space and time while simultaneously correlating it to material morphology. The new measurement scheme presented herein and associated models has prompted the development of systems and methods further described herein that allows for research and optimization of energy flow in systems that are inherently disordered—not only relevant to novel semiconductors but also to the vast majority of natural systems such as photosynthetic organisms and neural networks.

Practically, to resolve how energy flow is impacted by spatio-energetic disorder requires not only measuring energy flow spatiotemporally but also directly correlating the measurement to morphological features. This correlation aside, recently, powerful spatiotemporally resolved approaches have been developed to visualize nanoscale energy flow using photoluminescence, transient absorption or electron scattering as contrast mechanisms. They achieve excellent time resolution, large dynamic range, chemical specificity, and excellent spatial sensitivity. Nevertheless, in their current implementations, most of these methods track only a subset of energy carrier type and rely on samples having specific optical or electronic properties, such as being absorbing yet low optical density, having large Stokes shifts, having strong emission, or being resistant to electron beams. They also currently measure energy flow in two dimensions, and most acquire a single pixel at a time. These constraints limit the variety of samples that can be studied. Ideally, a method would neither rely on specific optical properties, nor integrate information over any spatial dimension, nor require prolonged exposure or acquisition times. In overcoming these challenges, systems and methods were developed herein that leverages elastic scattering, a universal optical interaction, to directly track any type of energy carrier, irrespective of its optical properties, as it moves through any material on picosecond to millisecond timescales. Importantly, this approach enables simultaneous imaging of the nano-to-microscale morphological features that define the spatio-energetic landscape of the material, providing much sought-after structure-function correlations.

The systems and methods of the disclosure utilize the exquisite sensitivity of interferometric scattering microscopy (iSCAT). In iSCAT, light reflected from a refractive index interface, such as the sample-substrate interface, is used to amplify the scattering signal of interest from the sample with a specific phase relationship. This interferometric technique provides three-dimensional (3D) imaging capability through phase contrast and enables label-free detection of extremely weak scatterers, down to single molecules. The systems and methods disclose herein enable the transformation of iSCAT microscopy into a stroboscopic technique, where an initial short pump light pulse generates a localized population of energetic carriers in the sample, while a second large-area probe light pulse interrogates the change in the spatiotemporal scattering profile of the sample induced by the first pulse (see FIGS. 1 and 2A). Accordingly, to map energy flow is to compare a first iSCAT baseline image to an image taken in exactly the same way, except that a first pulse a tiny spot of 'excitation' light in the center of the field of view to generate a population of excitons and/or charge carriers. The contrast in this second type of image relies on the amount of scattering due to the photoexcitation, which is proportional to the difference in index of refraction between it and the same spot in the unexcited film. By varying the time delay electronically between pump and probe with a currently available range from 20 ps to 2 ms, the variable rates at and extent to which energy carriers travel in three dimensions can be visualized. To simultaneously image sample morphology and energy carriers moving through the material, consecutive sets of wide-field images were recorded by a camera both in the presence and absence of the pump pulse. The ratio (pumpON-pumpOFF)/pumpOFF provides a spatial map of energy carriers, while the pumpOFF image provides a correlative morphological map of the sample. Correlation of energy flow with spatially resolved defects (obtained from baseline iSCAT images) allows for the quantification of how these defects impact energy flow and how important they need be eliminated. For purposes of this disclosure systems and methods that entail the foregoing, will be referred herein as stroboscopic interferometric scattering microscopy (stroboSCAT).

The contrast mechanism in stroboSCAT relies on a change in polarizability, and hence scattering cross-section, of the sample when it is excited by the pump pulse (see the Examples section presented herein). Indeed, molecular excited states as well as crystal lattices in the presence of energy carriers often possess vastly different polarizabilities compared to their unexcited counterparts. Furthermore, leveraging a change in induced dipole, rather than dipole moment, means that changes in the relatively spectrally-flat real part of the refractive index can be used for contrast, in addition to changes in the imaginary part which are the mainstay of transient absorption experiments. This quality enables both on- and off-resonant probing of optically-excited species, greatly enhancing the modularity of the systems and methods of the disclosure compared to absorption or emission-based approaches. stroboSCAT solves many of the aforementioned challenges by being widely generalizable due to its reliance on ubiquitous optical scattering. This attribute facilitates non-invasive, contactless probing through thick (opaque) or thin (transparent) samples that do not need to be emissive; high 3D spatial and temporal resolution and dynamic range; benign radiation dosage enabled by the high achievable contrast; and rapid and robust data acquisition by using wide-field detection, with each dataset in this disclosure employing <15-minute acquisition time. As further shown herein, the capabilities afforded by the systems and methods of the disclosure allow for spatiotemporal imaging of energy flow as a function of material morphology facilitate detailed and unprecedented insight into structure-function relations in a broad range of complex materials. In some embodiments presented herein, the systems and methods were used with solution-processed semiconductors, where visualizing heterogeneous energy flow within and across energetic barriers like GBs reveals how energetic obstacles dictate energy transport pathways. The results highlight the importance of fully characterizing the impact of heterogeneities within and across samples to tease out the underlying dynamic and morphological features that impact overall function in materials and are hidden from spatiotemporally averaged metrics. Just as single-molecule experiments provide insight far beyond ensemble-average measurements and introduce a new dimension to the understanding of biological function, detailed characterizations of energy flow as a function of individual nano-environments enables far more accurate generalized descriptions and precise control of energy transport in materials.

With the rise of semiconductor diversity and associated energy efficient materials fabrication, it is important to rationally design material systems and processing routes that will optimize efficiencies and robustness in the presence of disorder. To do so requires a fundamental understanding of how energy flows through inevitably heterogeneous landscapes. Until now, energy transport in materials has largely been characterized with either spatially- or temporally-averaged metrics. The systems and methods of disclosure, however, utilize an incisive and highly accessible new strategy to measure energy flow in heterogeneous spatioenergetic landscapes that combines high 4D spatiotemporal resolution and dynamic range, and universal applicability to different forms of energy and material properties, combined in a high-throughput platform. In addition, the detailed analyses enabled through stroboSCAT facilitate in situ correlation of different transport regimes to specific types of spatioenergetic disorder. First, it was shown herein that even within a single sample, and even with well-controlled morphologies with seemingly similar GBs, each crystalline interface impacts energy flow uniquely, depending on its exact formation conditions and morphology. More specifically, it was quantified in rich detail herein, the degree to which GBs slow down exciton or charge transport in different polycrystalline materials, including abrupt crystalline interfaces and high-curvature GBs. In all cases, energy transport is hindered by GBs, but even seemingly identical interfaces can affect energy flow in very different ways, leading to large energy transport heterogeneity within and across materials. As an important lesson, carriers that are unrestrained readily follow paths of least resistance in 3-d, facilitating boundary crossings at favorable connectivity sites. In this way, tracking carrier pathways with the systems and methods of the disclosure traces out the structure and functional connectivities of a material in three dimensions. Such detailed characterization on a given material could enable leveraging disorder to create efficient, unidirectional paths for energy transport to desired targets. For example, the data shown herein for $PbI_2$ and $PbCl_2$-based $MAPbI_3$ films suggest that, at least on microscales, the presence of chance, low trap state density paths can indeed significantly accelerate energy transport along a given direction. Characterizing, comparing, and contrasting energy transport in materials with different preparation procedures and chemical composition is important to gain predictive power over the role of disorder in energy transport; given its versatility, acquisition speed and accessibility, the systems and methods were found to be powerful analytical tools to study and inspect a wide range of emerging semiconductors, either for in-line analysis in materials processing plants, or to accelerate the identification of new defect-resistant materials and processing routes.

It is envisaged, the systems and methods presented herein will impact the study of energy materials far more broadly than in the exemplary examples provided herein. At a fundamental level, the polarizability contrast obtained from the systems and methods of the disclosure could be used beyond imaging applications as a direct indicator of how coupling strengths between an energy carrier and the surrounding lattice evolves as a function of space and time, providing information on, for example, electron-phonon coupling and polaron formation and how these processes affect energy migration. Furthermore, improvements in the rapidly developing sectors of detector technology, microscope stabilization and tunable laser sources will lead to immediate and far-reaching improvements in future implementations of the systems and methods of the disclosure to ultimately track a single energy carrier in real time as it moves through a material. Finally, a great strength of using scattering as a contrast mechanism is that huge range of processes—not just energy flow but also the transport of chemical species or ions—could be studied in the same level of detail and could shed light on catalytic cycles and chemical energy storage. Recent experiments showing the potential of iSCAT for cell imaging suggests that even many of the ultrafast dynamic processes that govern biological function, such as photosynthesis and neural signaling, could be revealed in live samples using stroboscopic interferometric scattering microscopy.

Encouragingly, results using the systems and methods of the disclosure with a moderate-speed camera, an unstabilized microscope, and a pair of sub-ns pulse duration diode lasers show excellent agreement of measured exciton and charge diffusivities with cited values from more complex and limited approaches, demonstrating the basic feasibility and competitiveness of the system and methods of the disclosure. To summarize the insights gained from the analysis afforded by the systems of the methods of disclosure, it was found that (i) GBs slow down lateral carrier transport, but that (ii) their opacity to charge carriers in MAPbI3 is greater at the film surface than in the bulk; (iii) each GB exhibits distinct conductivity properties, leading to anisotropic inter-grain connectivity patterns, especially in large-grain samples; (iv) in small-grain samples, increased GB scattering promotes more homogenization albeit smaller diffusivity; (v) effective termination of diffusion occurs much more quickly than recombination, i.e., carriers in MAPbI3 may have much longer lifetimes than the time over which they are mobile, precluding a direct relationship between diffusion length and D. Overall, the balance between depth-dependent diffusive and resistive forces at GBs, and between free and filled trap-state density and local carrier concentration, governs the charge carrier transport behavior at any given point in space and time in these polycrystalline semiconductors. As demonstrated, the systems and methods of the disclosure enabled: (1) the precise quantification of pathway-dependent diffusivities and spatially correlate their distribution, (2) identified at what point carriers encounter GBs, (3) identified how long and which pathways in 3-D carriers take to cross GBs (if at all); and (4) identified at what point diffusion terminates due to carrier trapping. None of these are available to the vast majority of techniques or analyses taught in the art, as these techniques extract an average diffusion parameter, typically diffusion length, obscuring all the underlying factors that are responsible for sample- or morphology-dependent variations. Thus, the systems and methods of the disclosure provide an unprecedented level of detail on how energy flows through disordered landscapes—a level of detail that should be replicated consistently across a wide range of material systems.

Provided herein are systems and methods that utilize a high-sensitivity, label-free, time-resolved optical scattering microscope that are able to (1) map the flow of energy in any semiconductor, and (2) correlate it in situ to the semiconductor morphology. The systems and methods of the disclosure provide for an unparalleled level of fundamental scientific insight into the nature and extent of energy flow in an important class of emerging electronic materials. The systems and methods of the disclosure can be optimized for turnkey benchtop operations in all leading printed electronics facilities, thereby facilitating green energy production and consumption, e.g., for mobile devices and the mobile sources used to power them.

The following examples are intended to illustrate but not limit the disclosure. While they are typical of those that might be used, other procedures known to those skilled in the art may alternatively be used.

EXAMPLES

Detailed description of the stroboSCAT setup: The implementation of stroboSCAT is illustrated in FIG. 1. For all data shown in the studies, the light sources used are two laser diodes (LDH-D-C-440 for the pump and LDH-D-C-640 for the probe, PicoQuant) driven by the same laser driver (PDL-828-S "SEPIA II" equipped with two SLM 828 driver modules and a SOM 828-D oscillator, PicoQuant). For the experiments shown in the text, a base laser repetition rate of 2 MHz was used, with the pump modulated at 660 Hz (every 3030 pulses), and the pump-probe delay times were controlled using the electronic delay capabilities of the driver with 20 ps resolution. The calibration of the 'coarse' and 'fine' adjustments of the diode driver electronic delays were verified using a computer-controlled mechanical translation stage (Newport) in a standard pump-probe geometry for delay times <2 ns, and using an oscilloscope for delay times >2 ns. It was noted that the diodes and repetition rates were easily interchangeable for different experimental configurations. For short-time dynamics (<400 ps), diode after pulsing can affect the accuracy of the measurements when using large diode powers. Therefore, care should be taken to minimize diode powers at the source, i.e. by reducing the driver current, rather than using neutral density filters in the beam paths. The resulting pulse FWHM are ~100 ps. Other laser sources can be used including, but not limited to, fiber lasers, ultrafast oscillators and regenerative amplifiers, in particular if a higher time resolution or broader spectral bandwidth is required.

Both pump and probe were spatially-filtered through 20 μm pinholes (SM) and telescoped to ~6 mm and 1 mm beam diameters, respectively, before entering the microscope. The two beams were combined using a long-pass filter (LP, DMLP505, Thorlabs) and directed to a custom-built microscope. A f=300 mm wide-field lens (WFL) was inserted in the probe beam path prior to LP to focus the beam in the back focal plane of the objective, resulting in wide-field illumination (~5-60 μm depending on the beam size prior to the WFL) of the sample. A 50/50 beam-splitter (BS) reflected the pump and probe light into a high numerical aperture (1.4 NA) oil-immersion objective (Leica HC PL APO 63×/1.40 NA) and on the sample, resulting in an overlapped confocal and wide-field illumination, respectively. Probe light reflected from the sample-substrate interface as well as scattered from the sample were collected through the same objective. The light was collected after the beam-splitter and focused onto a charged metal-oxide semiconductor (CMOS) detector (PixeLINK PL-D752, equipped with the Sony IMX 174 global shutter sensor) using a f=500 mm lens placed one tube length (200 mm) away from the back focal plane of the objective. The total magnification was 63×500/200=157.5. On square pixels of 5.86 μm this corresponded to 37.2 nm/pixel. One long-pass (FEL550, Thorlabs) and one bandpass (FLH635-10, Thorlabs) filter were used to filter out pump light in the stroboSCAT configuration. For wide-field emission, other appropriate emission filter arrangements were used for any given sample. Optional half- or quarter-waveplates were used to control the polarization of pump and probe beams in polarization-sensitive measurements, such as for TIPS-pentacene described herein. The aperture (Ap) below the beam-splitter in FIG. 1 was used to switch between reflection-only mode and interferometric scattering mode to ensure the contrast was due to a change in the scattering cross-section (vide infra).

While autofocusing capabilities were incorporated in the instrument, it was found that stroboSCAT measurements were rapid enough and the microscope stable enough that autofocusing was not needed. Custom built shutters using an Arduino and servo motors were used to block pump and probe light (if so desired) during program overheads to minimize sample exposure. The use of electronic delays and modulation, as well as a wide-field probe, means that there were no moving parts (apart from optional slow shutters) in the setup, leading to an extremely stable and compact (<1 $m^2$) setup, with system realignment needed only once every 1-2 months.

To trigger and synchronize the CMOS camera to the pump modulation rate, a phased dual-channel function generator was used to provide a 660 Hz TTL trigger signal to the CMOS and a synchronized 330 Hz trigger to the "Aux in" port of the laser driver. The latter started each driver sequence that comprise 3030 pump pulses and 6060 probe pulses, both at a 2 MHz repetition rate. With the CMOS triggered at 660 Hz (and total exposure time set at 1.3 ms), consecutive images correspond to (probe with pump ON) and (probe with pump OFF). The ratio pump ON/pump OFF for each consecutive pair was computed, and the ratio was averaged over 1000-3500 image pairs (total time with program overheads ~4-15 s per delay per scan for a full stroboSCAT image), depending on the signal-to-noise ratio (SNR) of the measurement. Averaged pump OFF images (iSCAT) were simultaneously recorded at each time delay. To be able to record images at 660 Hz, the region of interest was reduced to 192×192 pixels, i.e., ~7×7 μm.

The only image processing used was a 2×2-pixel binning prior to Gaussian fitting. The stroboSCAT images shown herein are raw, as-acquired images prior to 2×2 binning, and usually cropped to ~4×4 μm to emphasize the differential signal of interest. In principle, one could subtract negative-time delay stroboSCAT images for background subtraction, but it was found that it had no effect on the fitting accuracy due to large signal-to-background ratio. Setup automation and data acquisition were implemented in LabVIEW 2014 64-bit. Data analysis and plotting was performed using a combination of imageJ (Fiji), MATLAB and OriginPro.

The laser diodes provided high stability (<0.1% rms) and modularity in terms of repetition rates (single shot–80 MHz), electronic delays (20 ps–2 ms) and pulse sequencing, and fast warm-up times (<10 minutes from turning on) at the expense of time resolution compared to ultrafast lasers. It was noted that for interferometric contrast, the coherence length of the diode should be greater than the path difference between the scattered and reflected fields. However, very large coherence lengths were undesirable as they can lead to interference among many optical elements, thus degrading image quality. With a 2 nm spectral FWHM of the probe diode, it was estimated a coherence length of ~40-60 μm depending on the medium's refractive index—much larger than the path difference for any films or crystals deposited on the substrate, but not large enough to lead to much interference from optical elements in the beam path. Ultrafast lasers with >30 nm spectral bandwidths (<2 µm coherence length, i.e. in principle still large enough for many samples, can likely be used as effectively for stroboSCAT to improve time resolution. Another advantage of pulsed diodes was the low peak powers needed compared to highly impulsive (<100 fs) excitation for the same amount of overall excited state population. For short-pulse excitations, multi-photon effects, sample damage and heating should be carefully taken into consideration. For example, at the typical GW/cm$^2$ peak powers used in many pump-probe experiments, carrier temperatures in semiconductors can reach ~10$^5$ K, leading to the observation of hot-carrier dynamics over several hundred picoseconds that was not observed in the experiments using peak powers that were three orders of magnitude lower.

stroboSCAT contrast mechanism. In iSCAT, high sensitivity is achieved through interference of the scattered light of interest from the sample with light reflected at the substrate-sample interface (e.g., coverslip-sample interface). The light intensity reaching the detector, $I_d$, can be described as (1):

$$I_d = E_i^2 [r^2 + s^2 + 2r|s|\cos \phi]$$

where $E_i$ is the incident electric field, r is the reflectivity of the interface, s is the scattering cross-section of the object of interest, and φ is the phase difference between scattered and reflected light. The scattering cross-section scales with the particle size raised to third power, so the s$^2$ term, which is usually the signal of interest in dark-field microscopy, scales with particle size raised to the sixth power, contributing very little to the overall signal for scatterers <50 nm. However, the interferometric cross term scales with s rather than s$^2$, and is amplified by the reflectivity term r. This term thus dominates for small particles and allows for extremely high sensitivity measurements to be made by just increasing the incident electric field. Furthermore, φ can be expanded into $$\phi = \phi_{gouy} + \phi_{scat} + \frac{4\pi zn}{\lambda}$$

where $\phi_{gouy}$ is the Gouy (focusing) phase which is constant for a fixed objective-sample distance, $\phi_{scat}$ is the scattering phase (related to the material's refractive index), z is the object-interface distance, n is the refractive index of the surrounding medium, and λ is the illumination wavelength. Thus, the relationship φ∝z allows for three-dimensional contrast. For the MAPbI$_3$ films in FIG. 21, n(640 nm)=2.4, leading to a π phase flip every 67 nm, which is the same as the probe 1/e penetration depth (67 nm). In stroboSCAT, the differential contrast is defined as:

$$\frac{I_{pumpON} - I_{pumpOFF}}{I_{pumpOFF}} = \frac{I_{pumpON}}{I_{pumpOFF}} - 1 = \frac{2\cos\phi(|s_{pumpON}| - |s_{pumpOFF}|)}{r + 2s_{pumpOFF}\cos\phi}$$

When assuming that s$^2$<<rs cos φ (Born approximation) and that r doesn't change significantly between pump ON and OFF scenarios. Thus, the contrast is proportional to the change in the scattering cross-section between the material in the presence vs. absence of excited state species, which in turn is directly proportional to the change in polarizability (or refractive index) of the material between unpumped and pumped states. Thus, stroboSCAT benefits from the elegance, sensitivity and 3-d contrast achievable with iSCAT, but expands it to the entirely different realm of ultrafast energy flow.

Data analysis. Following 2×2 binning of the raw stroboSCAT images, several strategies can be used to extract the diffusivities. For isotropic diffusion (e.g., perovskite single crystals), the line profile for each time delay was plotted along any given axis, integrating across 4 pixel-wide rectangular regions. The resulting profile was fitted with a Gaussian function for each time delay, as described in more detail below.

For anisotropic diffusion (e.g., TIPS-pentacene), the same strategy was used for both long and short diffusion axes.

For heterogeneous diffusion, one possibility was to average over all radial angles, plot the radial profile and fit it with a half-Gaussian to obtain an average intensity distribution. To obtain plots like in FIG. 22A, the radial distribution was split into 10 to 30-degree slices and the intensity distribution of each slice was measured. However, when trapping occurs at grain boundaries, for example, the resulting carrier distribution was not normal and thus cannot be accurately fit with a Gaussian function. In these circumstances, the distance from the center of the radial distribution at which the population drops to 1/e was measured, and then the extracted half-width at 1/e value was converted to a Gaussian standard deviation using the relationship:

$$\sigma = \frac{w}{\sqrt{-2l(I_T)}}$$

where $I_T$ is the chosen Gaussian intensity threshold (i.e., 1/e in this case), assuming a normal distribution. Note that the chosen intensity threshold influenced the diffusion profiles. For all analysis of heterogeneous diffusion in the text, 1/e width was chosen. The Gaussian function used to fit normal spatial distributions was:

$$y(t) = A(t) * \exp\left(-\frac{(x - x_c)^2}{2\sigma^2(t)}\right)$$

where A(t) is a pre-exponential factor dependent on the contrast magnitude at each time delay t, $x_c$ is the center position, and σ(t) is the Gaussian standard deviation for each time delay. Using the property that the variance of convoluted Gaussians was additive, the solution to the diffusion equation in one dimension can be expressed as:

$$\langle x(t)^2 \rangle = \sigma^2(t) = \sigma^2(0) + 2Dt$$

Where $\langle x(t)^2 \rangle$ is the mean square displacement, $\sigma^2$ is the variance of the population distribution at any given time, and D is the diffusion coefficient. Thus, for ordered systems, $$D = \frac{\sigma^2(t) - \sigma^2(0)}{2t}$$

A more generalized form of the 1-dimensional diffusion equation applicable to both ordered and disordered systems can be written as:

$$\sigma^2(t) - \sigma^2(0) = 2D_0 t^\alpha$$

to account for subdiffusive transport behavior in disordered systems that exhibit trapping, where $\alpha<1$, or superdiffusive (ballistic) transport in systems with long scattering times compared to observation times, where a $\alpha>1$.

It was noted that the variance obtained from Gaussian fitting of the intensity profile in stroboSCAT images was strictly speaking a convolution of the spatial distribution of excited species with the point spread function (PSF) of the system, which itself was a convolution of the individual pump and probe PSFs as well as that of the detector. However, since the latter three are invariant over time, they do not contribute to the difference signal of $\sigma^2(t)-\sigma^2(0)$.

Sample preparation. Sample substrates: all substrates were used with 22×22 mm or 24×50 mm VWR #1.5 glass coverslips. Every substrate was subjected to an extensive cleaning procedure as follows: 15 min sonication in a 2% hellmanex solution in NANOpure deionized water, followed by several quick rinses in NANOpure deionized water; 2×15 min sonication in NANOpure deionized water; 10 min sonication in acetone; 10 min sonication in isopropyl alcohol; immediately dried under a flow of filtered nitrogen; cleaned with an $O_2$ plasma for 3 minutes in a reactive ion etch chamber.

Reagents and provenance: All reagents were used as received without further purification. Methylammonium bromide (MABr, GreatCell Solar); methylammonium iodide (MAI, GreatCell Solar); Cesium bromide (CsBr, Alfa Aesar); lead bromide ($PbBr_2$, Alfa Aesar); lead iodide (PbI2, Alfa Aesar); lead chloride ($PbCl_2$, Alfa Aesar); lead acetate trihydrate ($Pb(Ac)_2$, Sigma-Aldrich); 6,13-Bis(triisopropyl-silylethynyl)pentacene (TIPS-Pentacene, Sigma-Aldrich); Trichloro(phenethyl)silane (TPS, Sigma-Aldrich); poly(methyl methacrylate) (PMMA, $M_w$=120,000, Sigma-Aldrich). All solvents were purchased from Sigma-Aldrich.

Sample handling: All samples apart from silicon and perovskite single crystals were prepared in a sealed glovebox with nitrogen atmosphere and with <2 ppm $O_2$ and $H_2O$. Once prepared, the samples were sealed between two substrates using epoxy (EPO-TEK) in the glovebox, thus protecting from water and oxygen exposure during measurements. For atomic force microscopy measurements on thin films, another sample was prepared consecutively under the same conditions and using the same solution but wasn't sealed between the two substrates. Single crystals were all grown at ambient conditions. Once grown, they were brought into the glovebox, placed on clean substrates, and 200 μL of a 40 mg/mL solution of PMMA in chloroform was dropcasted on the crystals to keep them in place and prevent exposure to oxygen and moisture during measurements.

Metal-halide perovskite single crystals: $MAPbBr_3$ single crystals were prepared according to a published procedure using anti-solvent vapor diffusion as taught in D. Shi et al. (*Science* 347:519-522 (2015)). Briefly, a 1:1 molar ratio, 0.2 M solution of $PbBr_2$/MABr was prepared in N,N-dimethyl formamide (DMF). Once dissolved, the solution was filtered using a 0.2 μm PTFE syringe filter. 2 mL were placed in a clean 4 mL vial, which was placed inside a larger scintillation vial filled with dichloromethane. The large vial was sealed and crystals were left to grow for 1 week, ending up in hyper-rectangular crystals of dimensions ~3×3×1 mm.

$CsPbBr_3$ single crystals were also grown using anti-solvent vapor diffusion according to H. Zhu et al. (*Science* 353:1409-1413 (2016)). The same procedure as that described for $MAPbBr_3$ was used, with a 1:1 molar ratio, 0.04 M solution of $PbBr_2$/CsBr in DMF and using nitromethane as antisolvent. The crystals were left to grow for 3 weeks, ending up in large hyperrectangular crystals of dimensions ~20×2×2 mm, which were cleaved before mounting on substrates for measurements.

$MAPbBr_3$ polycrystalline films were prepared by dissolving MABr and $Pb(Ac)_2$ in a 3:1 molar ratio in DMF for a final concentration of 0.5 M. The solution was spin-cast at 2000 rpm for 60 seconds. The films were subsequently annealed for 5 minutes at 100° C.

$MAPbI_3$ polycrystalline films were prepared using different published processing routes, described briefly below:

$Pb(Ac)_2$ precursor films were prepared by dissolving MAI and $Pb(Ac)_2$ in a 3:1 molar ratio in DMF for a final concentration of 0.5 M. The solution was spin-cast at 2000 rpm for 60 seconds. The films were subsequently annealed for 5 minutes at 100° C.

$PbI_2$ precursor films were prepared by dissolving MAI and $PbI_2$ at a 1:1 molar ratio at 200 mg/mL in DMF. The solution was spin-cast at 2000 rpm for 30 seconds. The films were subsequently annealed for 20 minutes at 100° C.

$PbCl_2$ precursor films were prepared by dissolving MAI and $PbCl_2$ at a 3:1 molar ratio with final concentrations of 2.64 M and 0.88 M, respectively. The solution was spin-cast at 2000 rpm for 60 seconds. The films were subsequently left to dry for 30 minutes at room temperature in the glovebox, followed by annealing at 90° C. for 150 minutes.

TIPS-pentacene was dissolved in toluene at 5 mg/mL and filtered through a 0.45 μm PTFE filter. The substrates were treated by leaving them to soak overnight in a petri dish with a solution of 190 μL TPS in 100 mL toluene, then rinsing them with toluene and drying them prior to deposition. The TIPS-pentacene solution was then spin-cast at 250 rpm, and then solvent-vapor annealed at 60° C. in a toluene-saturated atmosphere for 24 hours.

Silicon wafers were prime-grade P-type, boron-doped wafers purchased from WaferNet, Inc., without further modification.

Figure 14:
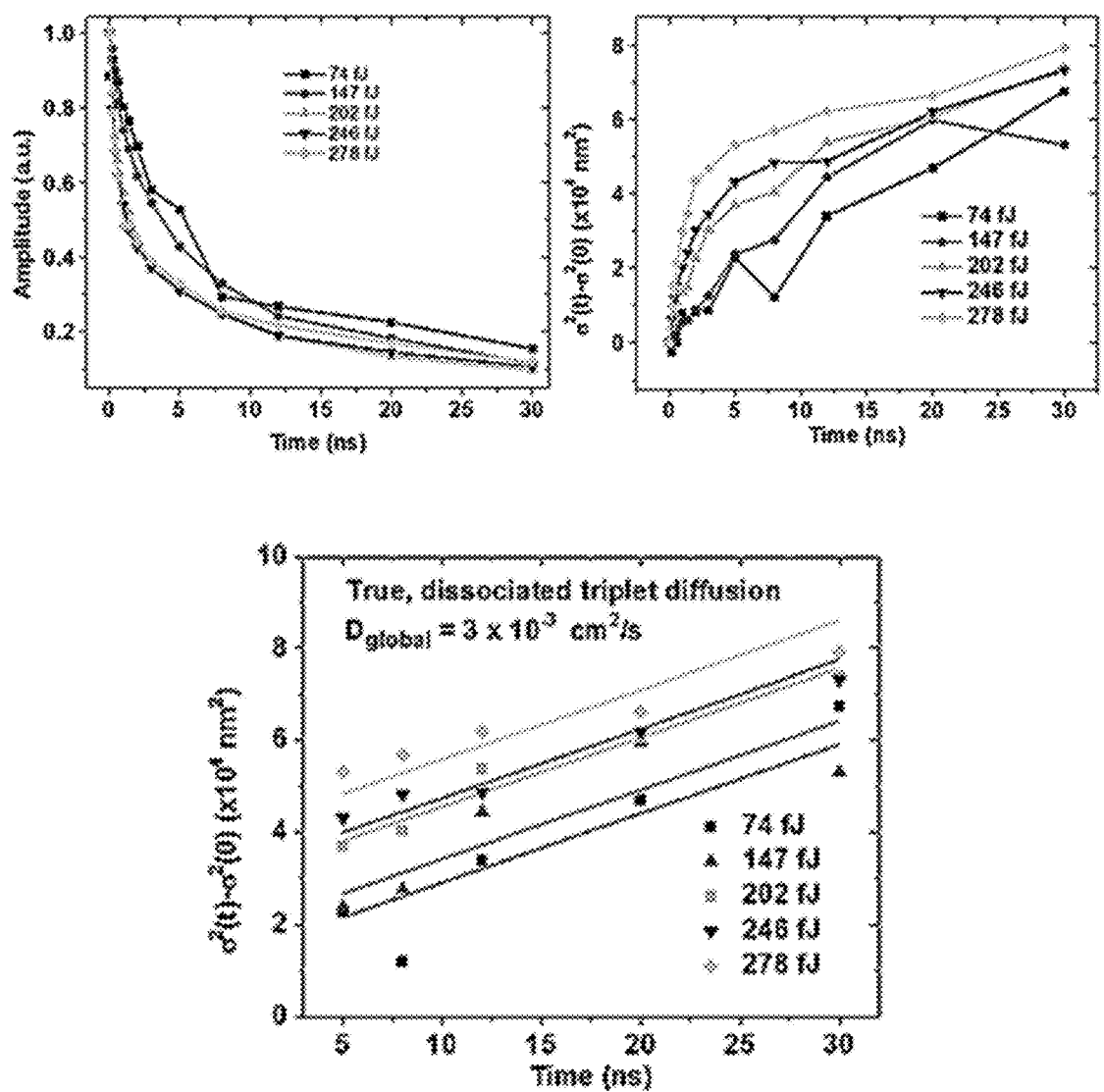
FIG. 14 shows that in TIPS-Pentacene, early-time dynamics are dictated by singlet-fission into two triplets and the reverse process of triplet fusion into a singlet, which affects the rate of exciton migration since singlets diffuse faster than triplet excitons. The combination of this interplay with singlet-singlet annihilation gives rise to nonlinear diffusive dynamics for so long as triplets are strongly bound—up to nanoseconds, as seen in the middle panel. To eliminate singlet-singlet and free triplet-triplet annihilation and concentrate on intrinsic singlet-triplet interchange, the measurements are taken at 147 fJ (140 uJ/cm$^2$ peak fluence), no significant changes in the peak amplitude decay between 74 and 147 fJ (the left panel plots the normalized peak Gaussian amplitudes of the stroboSCAT signal) were detected. At higher fluences, faster decay of the peak amplitudes at early times is observed, resulting in faster apparent diffusion. At long times (>5 ns), once all triplets are fully separated, linear diffusivities of 3×10$^{-3}$ cm$^2$/s are observed for all fluences used (right panel), which we assign to free triplet diffusion in TIPS-pentacene.
Figure 15:
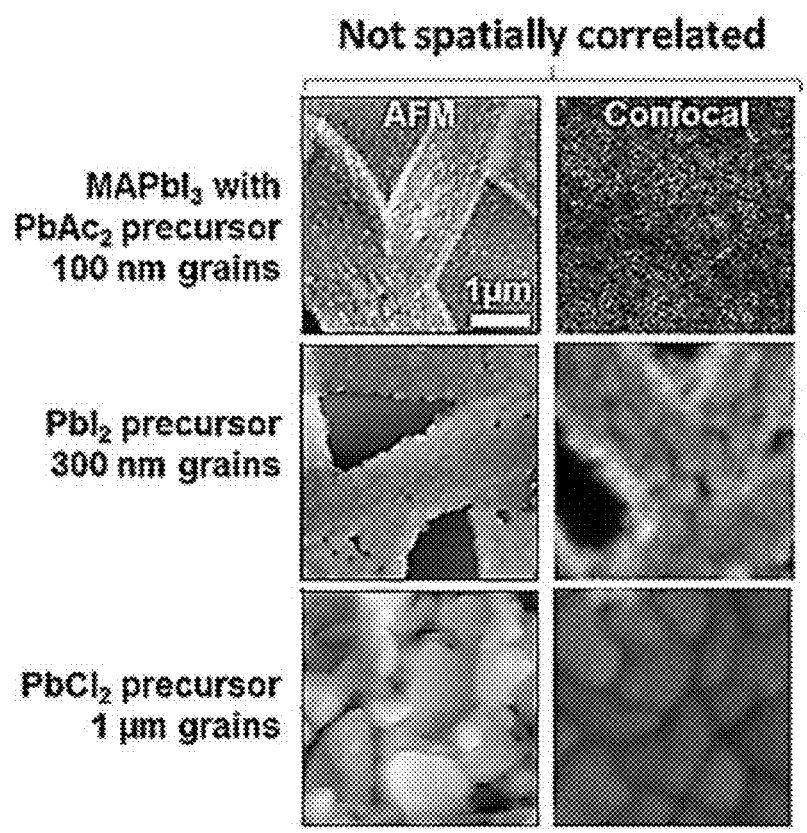
FIG. 15 presents AFM and confocal images for the three MAPbI$_3$ films studied, allowing to extract approximate grain sized for each sample.
Figure 16:
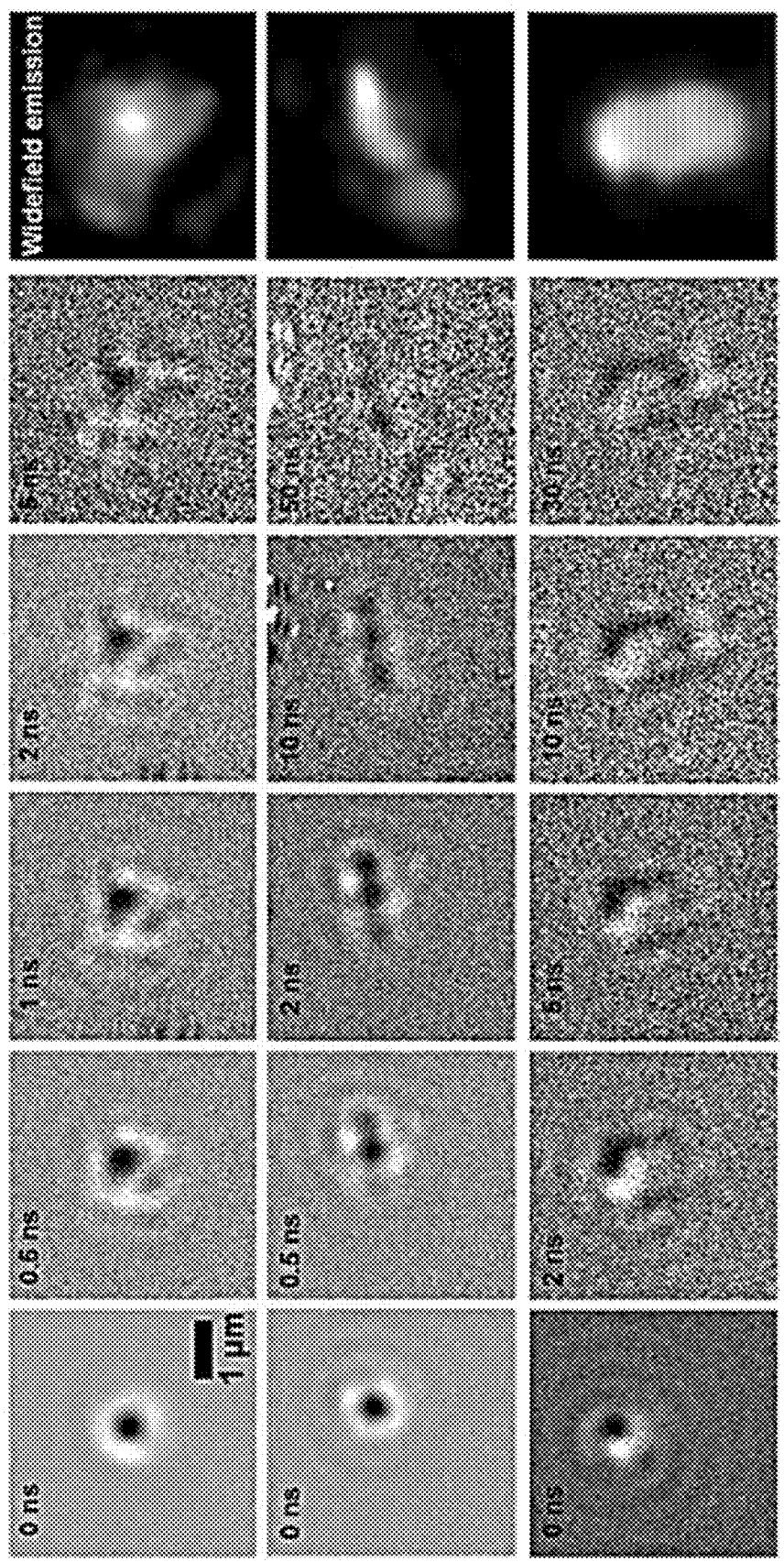
FIG. 16 illustrates spot-to-spot heterogeneity within a single film of MAPbI$_3$ made with PbCl$_2$precursor. Both the stroboSCAT time series and widefield emission show vastly different inter-grain connectivity patterns at each spot. Trapping times differ too, with some spots exhibiting population expansion up until 5 ns while others display expansion up until 30 ns. Good correspondence between wide-field images and stroboSCAT images at late times confirm that stroboSCAT captures the full extent of carrier diffusion; however, some differences between wide-field and stroboSCAT images at late times can arise if electron and hole transport are substantially different, for example due to preferential trapping of one species at GBs, since excess free carriers of one species will not give rise to PL but will still change the polarizability of the medium. All excitation fluences are 10 µJ/cm$^2$ (n$_0$~1.5×10$^{18}$ cm$^{-3}$).
Figure 16:
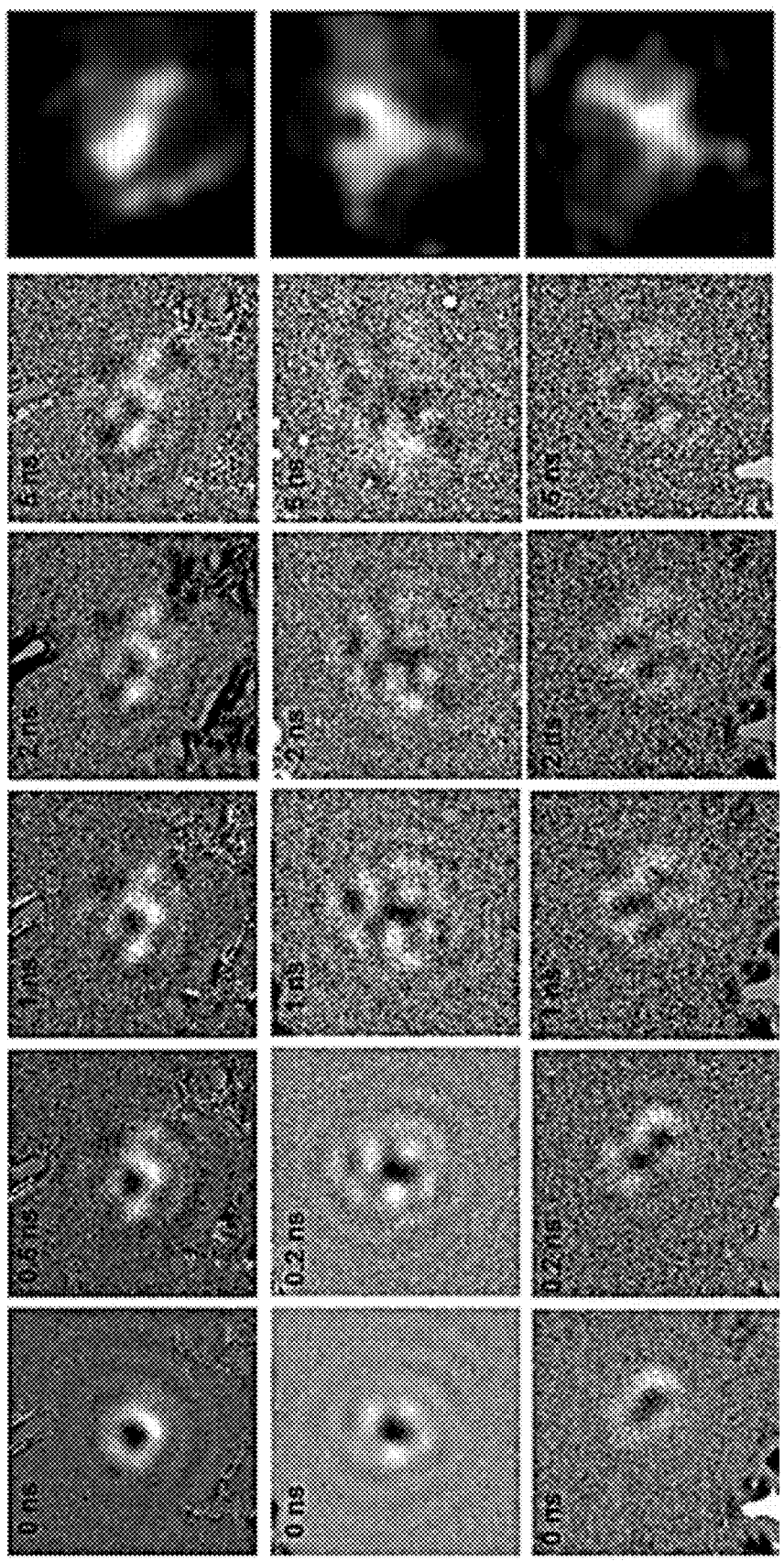
Figure 17:
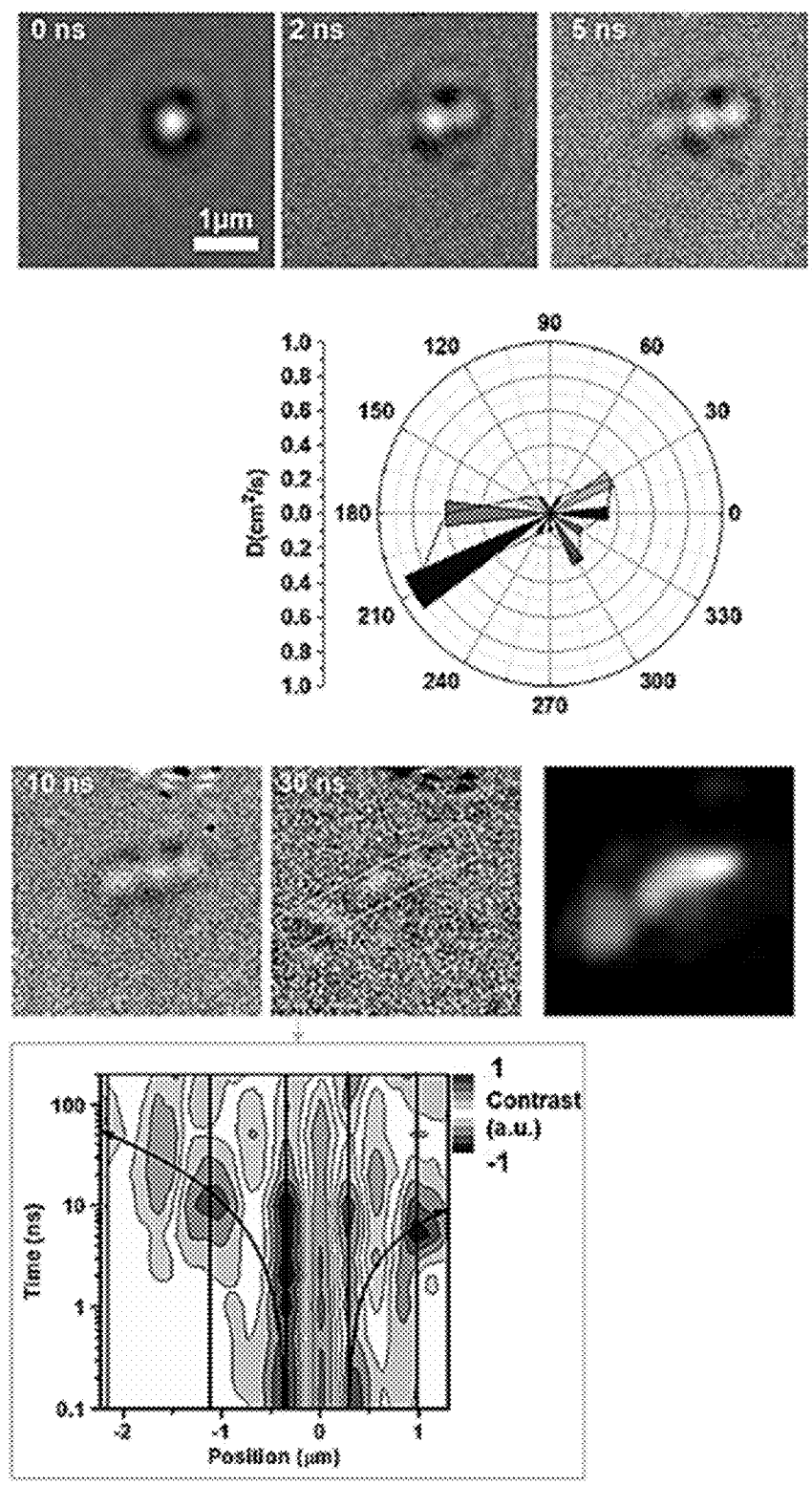
FIG. 17 provides an analysis of relatively 1-dimensional carrier diffusion from the data in row 2 of FIG. 16 for MAPbI$_3$ from PbCl$_2$precursor. Similar angular heterogeneity is observed as for the data in FIG. 21 of the main text. The plot at the bottom-right provides another means to visualize 3-dimensional diffusion as a function of time, with negative contrast (blue) indicating carriers moving into the film and clearly delineating the location of GBs, which are highlighted with black vertical lines.
Figure 18:
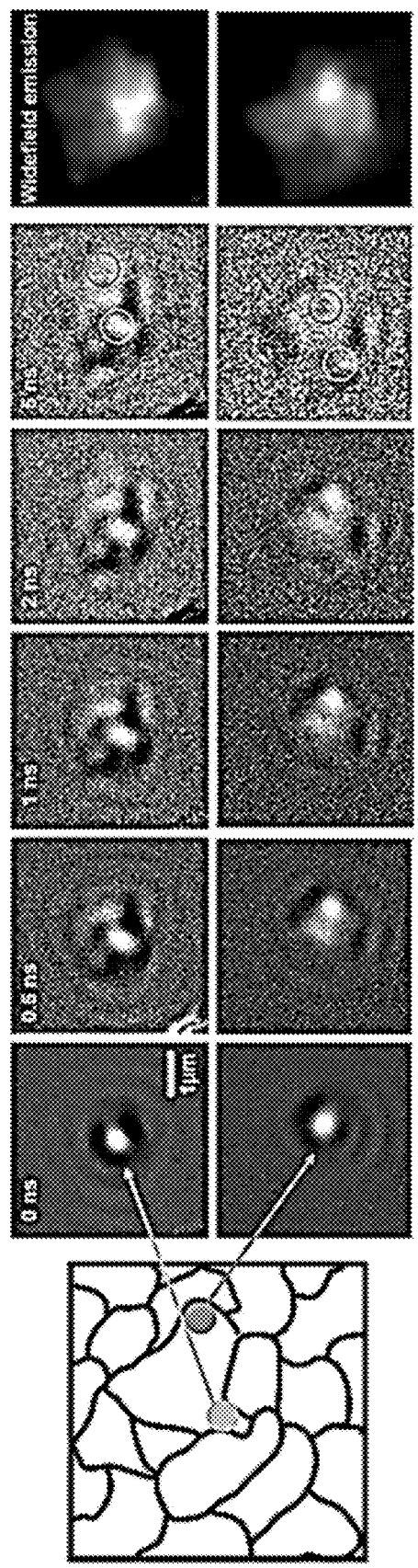
FIG. 18 provides specific intra- and inter-grain connectivity patterns determine carrier diffusion pathways in large-grain MAPbI$_3$ (PbCl$_2$) films. Shown are stroboSCAT time series and wide-field emission images when pumping at two slightly offset spots in the same region of the film. The circles show where the initial distribution of free carriers are injected. The same circles are overlaid on the 5 ns images to allow spatially correlating the two images. The final carrier population distribution and contrast flips correspond almost perfectly, confirming that fast intra-grain transport and preferential inter-grain connectivities across depth- and lateral-dependent paths of least resistance through GBs define overall carrier transport pathways. Note that even though carriers can cross GBs more readily below the film surface, GBs still act as bottlenecks to carrier transport due to their average resistivities being higher than intragrain resistivities. Note also that some GBs clearly possess larger average resistivities than others, acting as more effective bottlenecks to carrier transport.

Current system resolution. As shown in FIG. 14, the 440 nm pump beam profile has a FWHM of 306 nm, which is ~twice the size for a diffraction-limited spot. The total system spatial resolution is:

$$\sqrt{306^2+(635/2.8)^2}=381 \text{ nm}$$

Using a diffraction-limited pump could improve the resolution to a best-case scenario (with these wavelengths) of ~276 nm. A non-diffraction-limited beam by under-filling the objective was opted for in order to avoid polarization scrambling in the focal plane, which would become an issue for polarization-sensitive measurements such as on TIPS-pentacene. The system temporal instrument response function (IRF) was determined to be ~240 ps using a half-Gaussian to fit the signal rise-time in a stroboSCAT experiment on TIPS-pentacene.

Distinguishing scattering from normal reflection. It was possible to separate scattered and illumination light near the back focal plane of the objective by making use of the fact that small scatterers (e.g., individual energy carriers, quantum dots, nanoparticles, etc.) near a refractive index interface radiate the majority of photons toward angles greater than the critical angle determined by the interface. The result was that the scattered field was distributed in directions primarily associated with a high numerical aperture of the objective. Since wide-field illumination only required a very low numerical aperture, the spatial frequencies of the scattered and illumination beam were well separated near the back aperture of the objective. Indeed, it has been shown in iSCAT experiments that the illumination beam can be attenuated with an appropriate partial reflector while transmitting the vast majority of the scattered field in order to increase the iSCAT contrast significantly.

Figure 5:
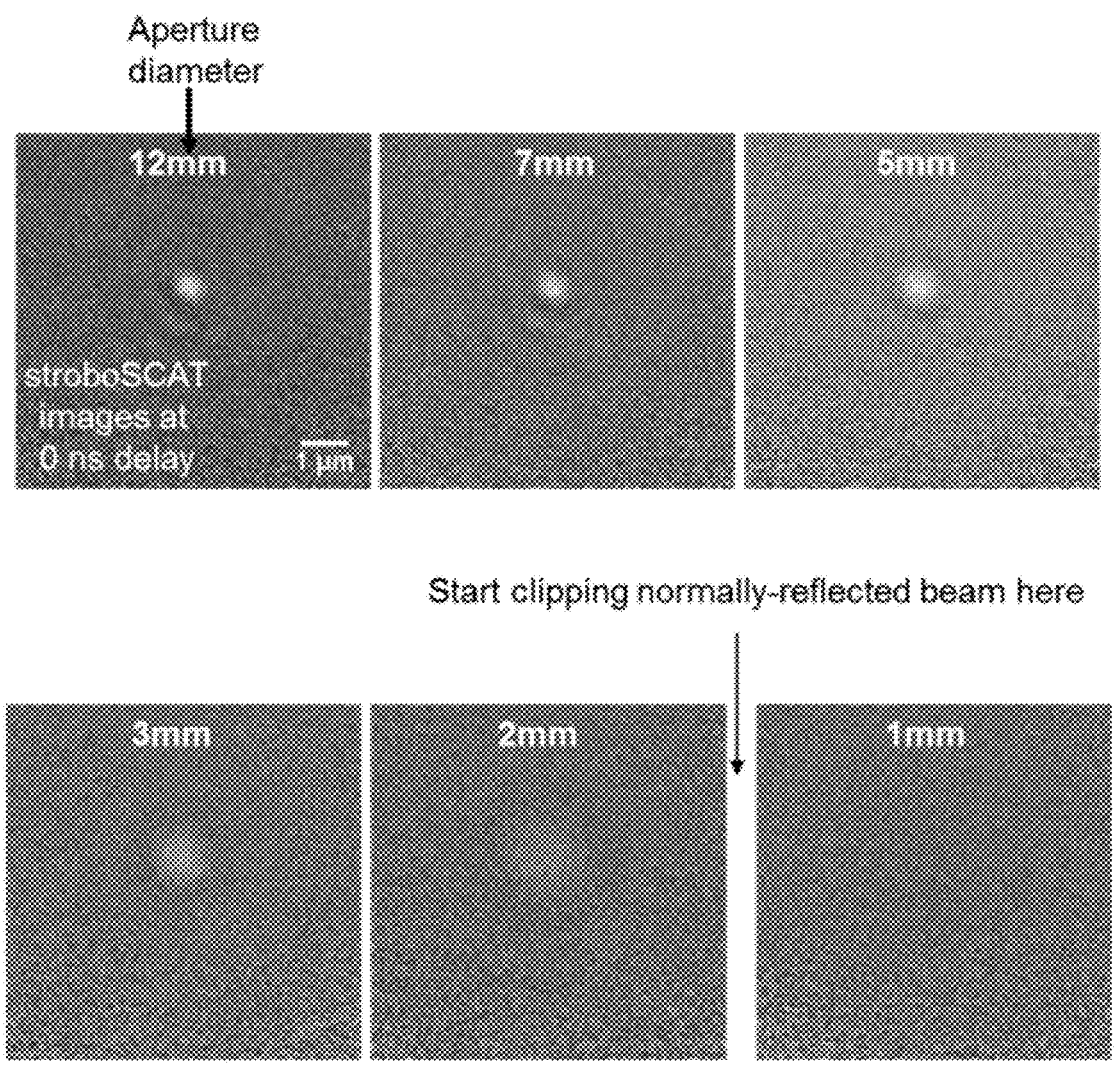
FIG. 5 presents stroboSCAT contrast for TIPS-pentacene at 0 ns delay as high spatial frequencies of the scattering field are progressively filtered out using an aperture near the back aperture of the objective.
Figure 6:
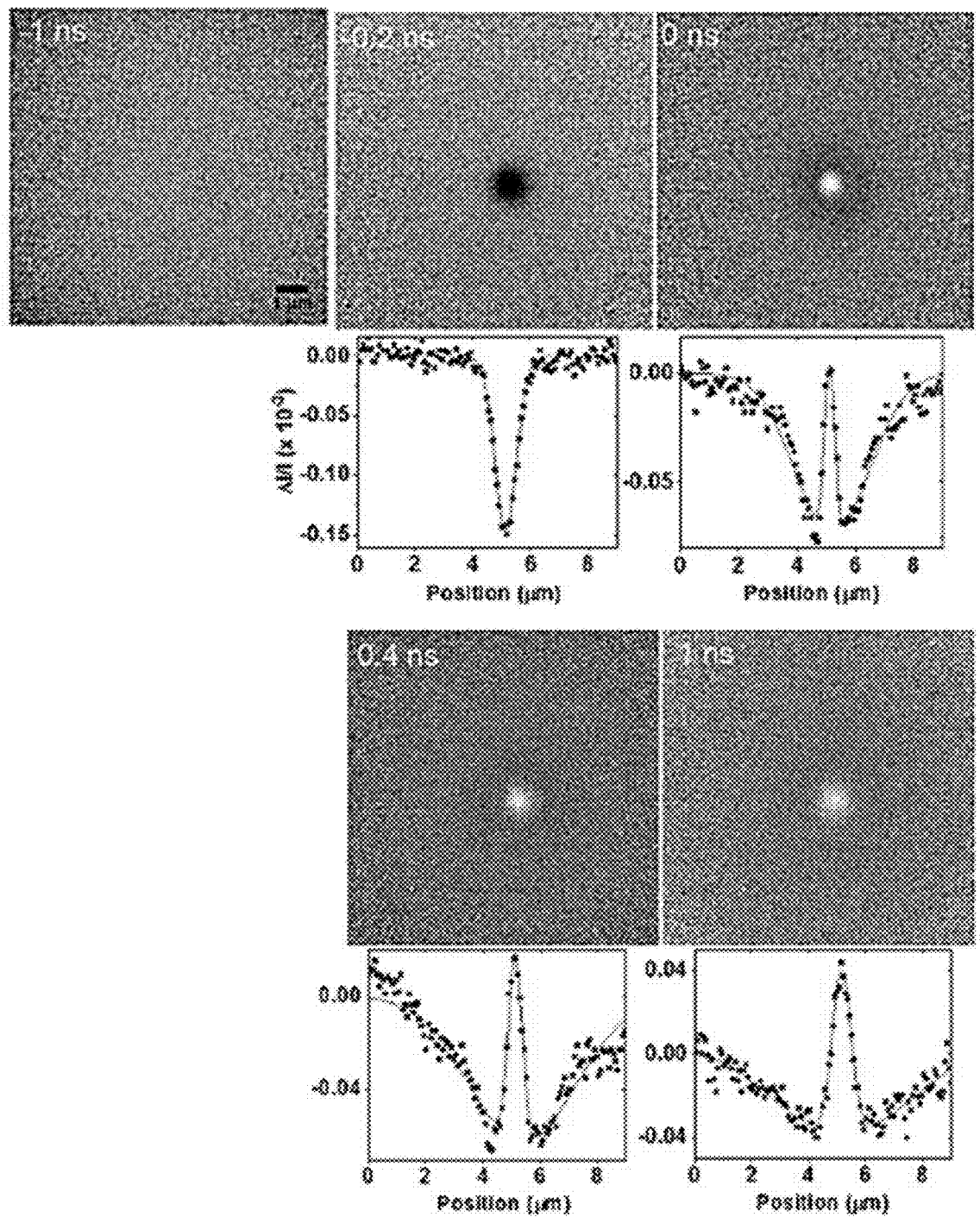
FIG. 6 provides a stroboSCAT time series on a p-doped Si wafer. Just before 0 ns pump-probe delay, the signal exhibits negative (dark) contrast, which rapidly expands with time. At 0 ns pump-probe delay, a positive-going contrast appears in the center of the distribution, indicating a different species is formed rapidly. Double-Gaussian fitting of the signal allows extracting the diffusivities for each species. The negative Gaussian expands at a rate of 35±8 cm$^2$/s and the positive Gaussian expands at a rate of 0.6±0.2 cm$^2$/s (FIG. 2). These are close to reported values for electron and thermal diffusivities in Si. In addition, heat and free electrons are indeed expected to produce opposite changes to the refractive index of silicon at optical wavelengths. This is attributed to the negative (dark) contrast to photogenerated electrons, and the positive (bright) contrast to heat deposited in the lattice through relaxation of excess energy from above-bandgap excitation as well as electron-electron, electron-hole and electron-phonon scattering that happen primarily in the center of the carrier distribution, where the carrier density is largest. Note that this is the only sample where fitting errors are larger than the variation from dataset to dataset, primarily due to fast-diffusing carriers, low contrast and the need for double-Gaussian fitting. Fluence is 0.5 mJ/cm$^2$ (n$_0$≈2×10$^{19}$ cm$^{-3}$). 10-scan averaging and 8-pixel wide integration are used for the plots shown. Both pump (440 nm) and probe (640 nm) are far above the silicon bandgap (~1100 nm) and distinct from pump-induced absorption changes.
Figure 7:
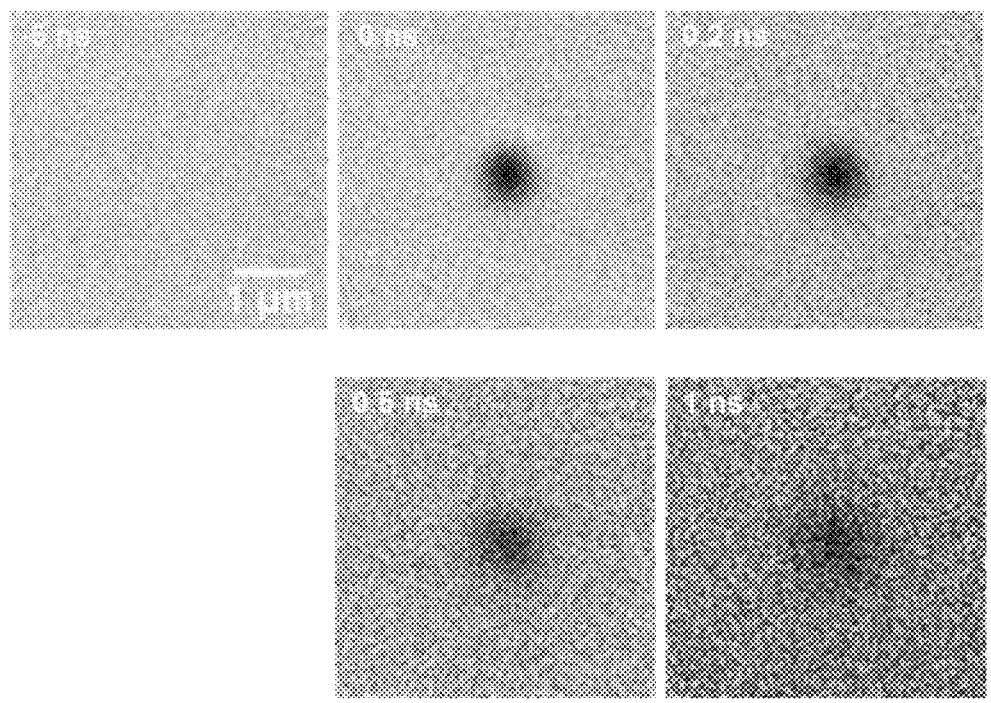
FIG. 7 provides a stroboSCAT time series on a $CsPbBr_3$ single crystal. The extracted diffusivity from this dataset is 1.00±0.08 cm$^2$/s. The average and standard deviation across 6 datasets and 2 crystals are 1.0±0.2 cm$^2$/s. Fluence is 21 μJ/cm$^2$ (n$_o$≈4×10$^{18}$ cm$^{-3}$). The pump at 440 nm is above bandgap, while the probe at 640 nm is non-resonant with both ground and excited state absorption.

To verify that the same separation of spatial frequencies is present in stroboSCAT, and to confirm the signal source was scattering from a collection of small particles (and not just a change in the reflectivity r of the interface), introduced an aperture near the back aperture of the objective was introduce (see FIG. 1) to interchange between stroboSCAT and normal reflectivity modes. FIG. 5 showed the effect of spatially filtering the scattered field only while the normally-reflected illumination field was fully transmitted. The stroboSCAT signal magnitude reduced and the spatial extent of the signal on the detector plane increased as high spatial frequencies were filtered out. These experiments suggest that the scattered field emitted toward high-NA associated directions was indeed responsible for the observed signal. Furthermore, a beam stop can be inserted in the normally-reflected beam while transmitting the scattered field only, as in dark-field backscattering microscopy. Using the same experimental conditions, no signal above noise on the detector was observed, indicating that the interferometric cross-term dominated the differential signal magnitude, $s^2 \ll rs \cos \varphi$.

Figure 13:
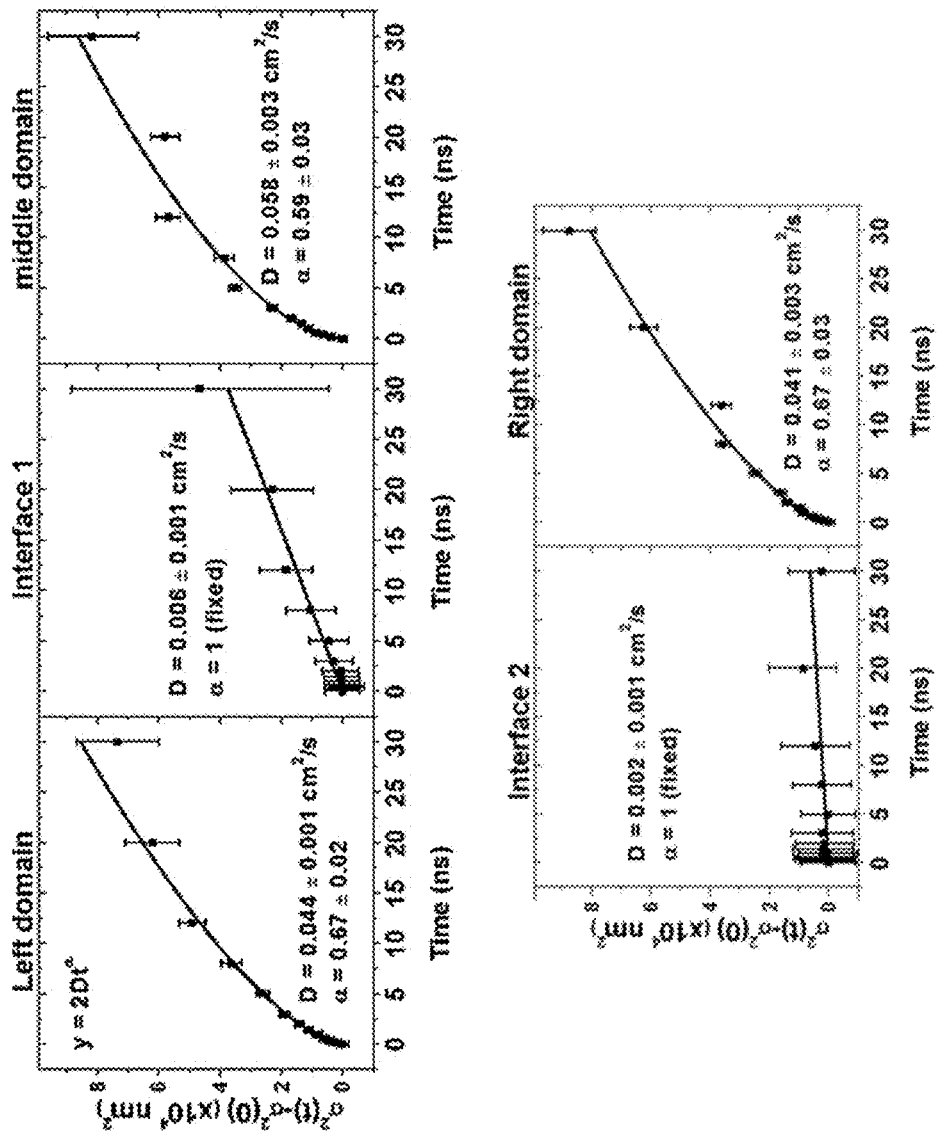
FIG. 13 presents population expansion plots for the data in FIG. 12. A subdiffusive model is used to fit the data and extract an effective D$_0$ at early times and to compare across grains and GBs. Due to the larger noise at GBs and apparently linear diffusive behavior, a linear model was used to avoid over-fitting.

Supporting experimental data. All reported injected energy carrier densities, $n_o$, were calculated as $n_o = j\alpha$, where j is the peak pump fluence in photons/cm$^2$, and a as the absorption coefficient. Peak photon fluence was calculated from peak energy fluence, which was defined here as $2E/\pi r^2$, with E being the pulse energy and r being the beam radius at $1/e^2$. For each sample, a pump-power dependence over several time delays was performed in order to ensure that the rate of decay of the stroboSCAT signal peak amplitude was power-independent over the range of powers used. In this way we, many-body effects such as Auger recombination were minimized so as to not contribute significantly to the determined diffusivities. Using higher powers may lead to wrong estimations of the diffusion coefficient as the population distributions approach flat-top profiles rather than Gaussian profiles, which if fit with a Gaussian function will appear as a larger-than actual distribution width. For TIPS-Pentacene, power-dependent behavior was non-trivial (see FIG. 13).

Results. stroboSCAT was used to spatiotemporally resolve energy flow in a wide range of semiconductors, demonstrating its capability over four orders of magnitude in space and time, on both neutral and charged excitations migrating through both ordered and disordered, transparent and opaque, and emissive and non-emissive samples, using on- and off-resonant probing in organic, organic-inorganic, and inorganic semiconductors. As an example of imaging diffusive behavior in an ordered semiconductor, FIGS. 2B and 2C show the spatial profile of charge carriers as a function of pump-probe delay in a methylammonium lead bromide (MAPbBr$_3$) perovskite single crystal. The diffusion can be modeled as a function of time t as $\sigma^2(t) - \sigma^2(0) = 2Dt$ to extract the diffusivity D, given a Gaussian distribution variance $\sigma^2(t)$. The achievable spatial precision was not limited by diffraction but rather by the lowest achievable distinction between the width of two Gaussian distributions, which depends on the shot noise-limited signal-to-noise ratio. The achieved fitting precision was as good as ±2 nm for measurement times under 10 minutes. FIGS. 2D and 2E summarize similar analyses on a variety of semiconductors using exactly the same setup configuration to image heat, neutral bound pairs of charges (excitons), and free charge carrier diffusion. The stroboSCAT results closely match published values for the materials whose diffusivities have previously been determined. One notable observation in FIGS. 2D and 2E underscored the importance of studying energy flow in emerging semiconductors as a function of disorder and lays the groundwork for the subsequent discussion. Processing methods, such as solution-casting, often introduce GBs and large trap-state densities that generally impede energy flow. For example, the MAPBBr$_3$ carrier diffusivities in FIG. 2 were reduced more than fourfold in polycrystalline films compared to single crystals, with direct implications for their suitability in a wide range of semiconductor applications. Nevertheless, the impact of disorder and in particular GBs on energy flow can be non-trivial, depending greatly on their type, size and composition, demanding a detailed investigation of each scenario. As demonstrated below, stroboSCAT can directly image and morphologically correlate energy flow up to, within and across these energetic obstacles, using two classes of emerging semiconductors as case studies. The information extracted from these measurements far exceeded previously averaged analyzes used even in spatiotemporally-resolved studies. In particular, carrier trajectories were shown to be largely governed by paths of least resistance, leading to large energy flow anisotropies as well as heterogeneity within and across samples, precluding the viability of diffusive models and calling for new ways to interpret and quantify energy flow in disordered environments.

First explored was the effect of low-curvature domain interfaces on exciton migration in 6,13-Bis(triisopropylsilylethynyl)pentacene (TIPS-Pn) to understand how structural boundaries affect energy flow. This material was chosen because: (i) its singlet-fission capacity could in principle enable hybrid solar panels to exceed the Shockley-Queisser efficiency limit, provided exciton extraction at interfaces in efficient; (ii) energy transport along pi-stacked systems (see FIG. 20A) was highly dependent on distance between adjacent molecules and was thus expected to be highly affected by structural perturbations such as lattice mis-orientations; and (iii) sample morphology through solution processing can be carefully controlled. Films were prepared of TIPS-Pn containing few-micron sized crystalline domains separated by straight interfaces with crystallinity maintained right up to the interfacial region. In FIG. 20B, iSCAT images at two different probe field polarizations displayed two distinct crystalline domains (light vs dark) separated by such interfaces. Exciton migration imaged by StroboSCAT (see FIG. 20C) within a grain showed that at early time delays (see FIG. 20E), the migration was dictated by the interchange between singlet and bound triplet pair excitations, while beyond 5 ns only free triplets diffuse at 0.003 cm$^2$/s. Migration was anisotropic, with a ~6:1 preference to travel along the pi-stacked axis, which lied roughly perpendicular to the interfaces for the central narrow, wedge-shaped domain and parallel to the interfaces for the outer domain. The wedge-shaped central domain in this example provided an interesting opportunity to systematically quantify the effect of domain confinement by interfaces on exciton migration (see FIG. 20D). Population distribution expansion along the long diffusion axis are highlighted in FIGS. 20B and 20D are plotted in FIG. 20E. A clear difference was observed between the bulk crystalline domain and the most confined spot, with interfaces severely hindering exciton transport, decreasing it approximately 4-fold. Transport at the partially-confined area could be accurately modeled by a linear combination of bulk-like migration up to 3 ns, followed by confined migration, showing a clear transition from bulk-like to slower transport when reaching an interface. Transport properties across 15 grains and 17 GBs were measured in the same film and found that (i) exciton transport was always slower at GBs than in grains; and (ii) that transport properties across all measured grains were consistent, whereas transport at GBs exhibited very large variability from GB to GB, as indicated by the distribution of initial (t=0) diffusivities (see FIG. 20F). Indeed, it was expected that the interface formation kinetics, degree of lattice mis-orientations, void and impurity concentrations will give rise to a wide range of transport behavior at different interfaces. The high-throughput and correlative stroboSCAT measurements of exciton migration over nanometer length scales provided the ability to investigate energy transport properties in situ for each interface and surrounding crystal domains and to correlate these to their specific morphology. These detailed dynamic measurements will readily complement static atomic-level crystallographic or electron microscopy measurements for complete characterization of the structure-function relation of crystalline interfaces.

Figure 21C:
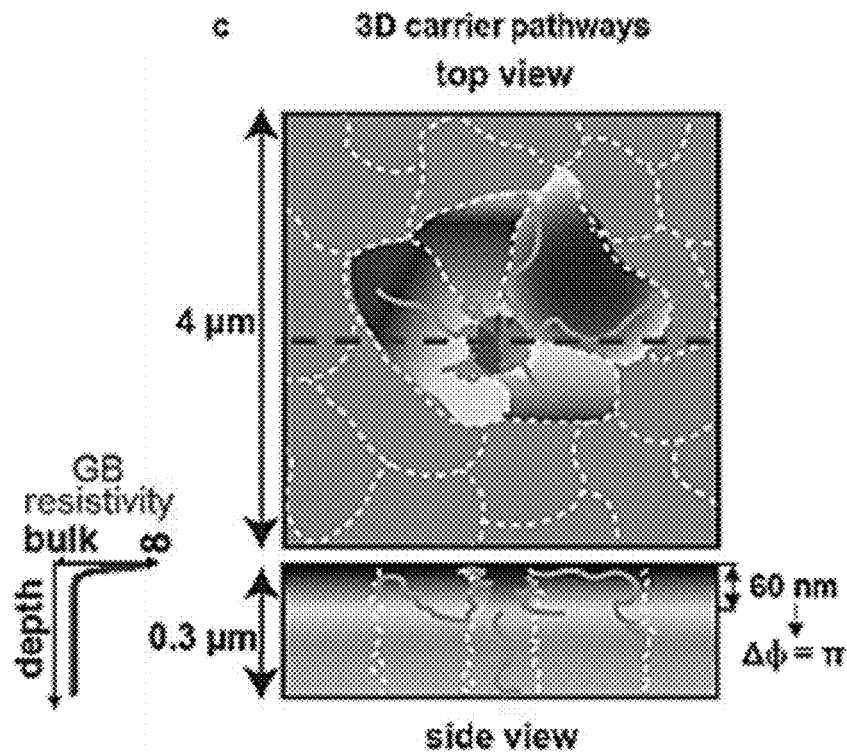

While large crystalline domains separated by abrupt interfaces provided a systematic and controllable environment to test the effects of crystalline mismatches on energy transport, a more commonly-encountered morphology in polycrystalline semiconductors consists of sub-to-few-micron grains whose GBs necessarily have higher average curvature. In these materials, energy carriers almost inevitably encounter one or multiple GBs during their lifetimes. GBs thus significantly impact bulk-averaged measures of energy flow such as charge mobility and recombination. There is, however, little consensus on the mechanistic role of GBs in determining these functional properties in a wide range of semiconductors despite a strong interest in establishing fundamental and predictive relationships between disorder, local electronic structure, and transport. Nowhere is the debate currently more salient than with metal-halide perovskites; despite impressive performance improvements for solar cell, display, and detector technologies, many questions remain regarding the role of GBs on charge carrier extraction efficiencies and degradation pathways, both of which currently limit their commercialization potential. The primary difficulty in resolving this challenge is in elucidating to what extent the functional impacts of GBs locally deviate from bulk-average-obtained metrics. This challenge is further complicated by the vast diversity of preparation routes for polycrystalline metal halide perovskites, which leads to radically different GB densities and compositions. This difficulty calls for high-throughput, thorough characterization of the range and variability of carrier dynamics at or near GBs across multiple samples. Next, it was shown that the unique 3D imaging capabilities and large temporal dynamic range of stroboSCAT were important to track carriers as they diffuse through polycrystalline perovskite films, informing the location and effect of traps, the lateral- and depth-dependent conductive properties of GBs, and the degree of material heterogeneity as a function of processing route. Along with stroboSCAT images (see FIG. 21A) at different time delays, the correlated steady-state wide-field emission pattern arising from the recombination of electrons and holes following pump excitation was elucidated (see FIG. 21B) and obtained using the same instrument. The good correspondence between stroboSCAT at late time delays and wide-field emission images confirmed that the full extent of carrier migration was captured by stroboSCAT. On average, films with smaller grains exhibited slower lateral carrier transport, confirming that GBs negatively affect inter-grain carrier transport. From the data presented FIG. 21A, 2D lateral angle- and time-averaged diffusion lengths (defined as $L_d=\sqrt{(4D\tau)}$) were extracted up to 2 ns of 180 nm, 200 nm, and 700 nm for films made respectively with $Pb(Ac)_2$, $PbI_2$ and $PbCl_2$ precursors. Interestingly, carrier diffusion appears to be more heterogeneous in large-grain samples than in small-grain ones. The films with the largest grain sizes ($PbCl_2$ precursor) presented a strong dependence on specific, local inter-grain connectivity, resulting in anisotropic diffusion. The smallest grain sample ($Pb(Ac)_2$ precursor) presented more isotropic and homogeneous diffusivities, presumably because of comparatively higher carrier scattering at GBs. It was noted that for the latter small-grain sample, the excitation spot created carriers both at GBs and within grains, resulting in an average measure of intra- and inter-grain transport. An intermediate behavior was observed at intermediate grain sizes ($PbI_2$ precursor) that are comparable to the pump waist, suggesting that at least some homogenization of transport was intrinsic to polycrystalline materials in spite of the non-infinitesimal spot size. Another important observation is that, in the largest-grain sample in FIG. 21A, the sign of the stroboSCAT contrast reversed as carriers encounter grain boundaries, illustrated schematically in FIG. 21C. These phase-flips were a consequence of carriers moving deeper into the film, with one phase-flip expected every 67 nm. Thus, stroboSCAT images showed that as a carrier encounters a GB, the path of least resistance was to travel deeper into the film rather than cross the GB. Nevertheless, as illustrated in FIG. 21C, once carriers migrate into the film, GB crossing into a neighboring grain occurred more readily. GBs thus act as solid walls at the film surface and direct carriers into the film toward regions of lower resistivity, allowing carriers to cross into neighboring grains, after which they may once again diffuse freely in 3 dimensions. These results concurred with studies that observed greatest heterogeneity and resistance at GBs at the film surface, but that suggested both trap-state density and GB resistance were reduced when moving in the bulk. Tracking carriers in 3D therefore enabled tracing with unprecedented detail the structure and connectivity pathways in these polycrystalline materials.

In the largest-grain sample in FIG. 21A, the sign of the stroboSCAT contrast can reverse from negative to positive. By correlating stroboSCAT measurements to structural maps in the same field of view, it is shown that these contrast flips occur only at GBs, as illustrated in FIG. 21C. It was ruled out that the contrast flips arise from a change in carrier density, scattering amplitude or heat, as these sign flips were not observed in any other region when varying the pump fluence over four orders of magnitude. Previously-reported changes in ground state bleach amplitude at GBs also do not explain contrast flips in stroboSCAT since no sign flips were observed in those measurements. These contrast-flips were thus attributed to a change in the phase of the interferometric cross-term combining the reflected and scattered fields. The cross-term phase depends linearly on the depth of the scattering object with respect to the sample-substrate interface, providing a direct measure of the axial position of the scatterer. The stroboSCAT contrast, in turn, scales with the cosine of the interferometric phase, multiplied by a decaying exponential factor arising from the finite probe penetration depth (FIG. 3C), such that only carriers within ~72 nm of the film surface are detected. Accounting for the detection noise floor, this scaling results in a strong negative contrast for carriers located within 0-26 nm of the interface and weaker positive contrast for carriers located at depths of 35-72 nm for the probe wavelength of 635 nm in $MAPbI_3$ films. A depth sensitivity of ±20 nm due to the phase profile being multivalued at depths between 35-72 nm was estimated (FIG. 3C). The observation of localized regions of positive contrast in these films implies that, at GBs, the density of carriers between 35-72 nm is significantly larger than between 0-26 nm. The stroboSCAT measurements for large-grain MAPbI3 in FIG. 21A therefore suggest that as a carrier encounters a GB near the surface of the film, the path of least resistance leads deeper into the film rather than across the GB, resulting in a very low density of carriers at GBs at the film surface. Nevertheless, as illustrated in FIG. 21C, once carriers have migrated deeper into the film, GB crossing into a neighboring grain becomes possible. The findings therefore provide this important mechanistic insight as to why recent conductive atomic force microscopy on $MAPbI_3$ films indicated infinite GB resistance at the film surface but that, somehow, carriers still migrate to adjacent grains.

Depth-dependent charge diffusion in MAPbI3(Cl) films were simulated using finite element analysis implemented in the MATLAB PDE toolbox. The parabolic diffusion equation is solved in a heterogeneous environment consisting of grains separated by abrupt grain boundaries. The code is implemented in a two-dimensional x-z (lateral-axial) plane. In brief, the simulations quantitatively reproduce the observed diffusion behavior and associated stroboSCAT contrast. The key aspect of the simulations is the inclusion of a depth-dependent diffusion coefficient at GBs. The model depends most sensitively on the depth at which the diffusion coefficient increases from ~0 at the surface to its intra-grain value. Structural information correlated to stroboSCAT measurements in the same field of view to further constrain the model and confirm the interpretation: contrast flips in the stroboSCAT data on $MAPbI_3$(Cl) films occur specifically at GBs and indicate that when carriers encounter GBs, they cannot cross into neighboring grains at the film surface, instead moving deeper into the film, where GBs are not as resistive.

Figures 19A, 19B:
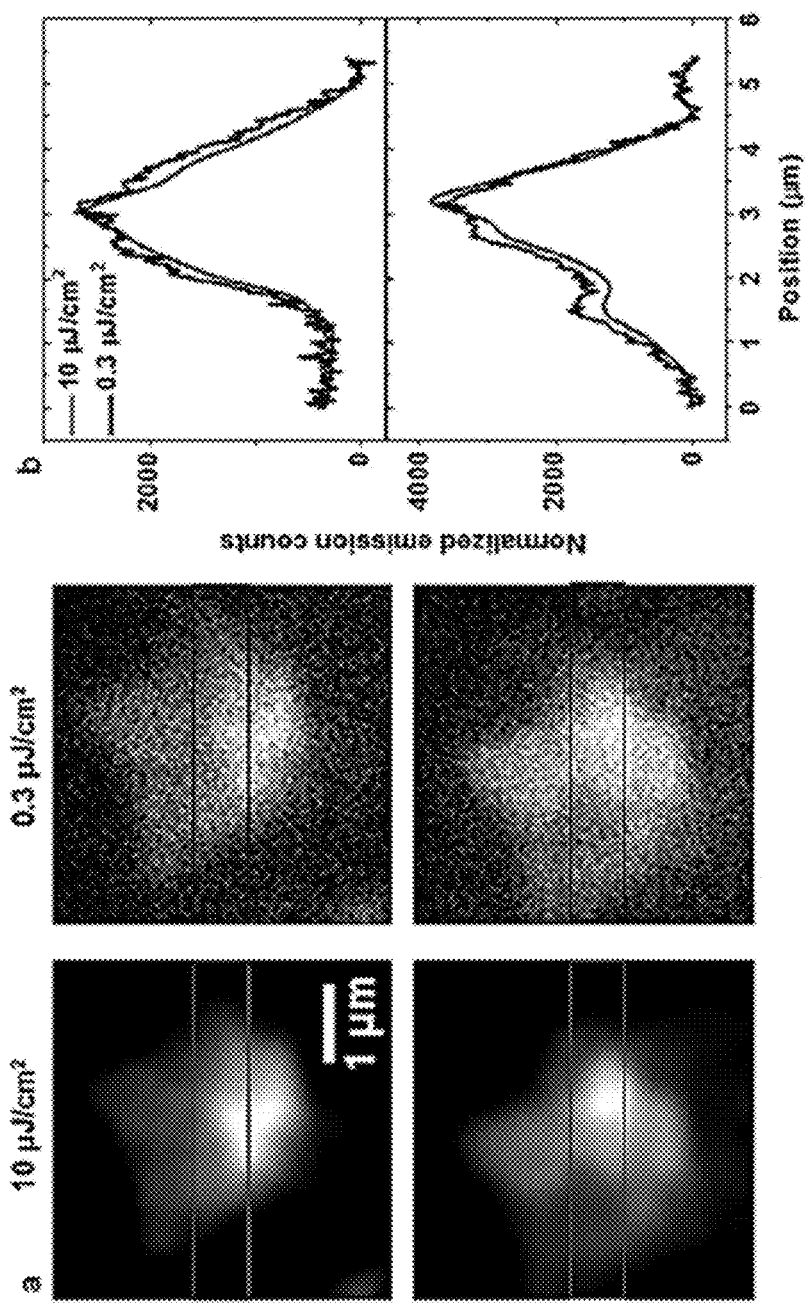
FIG. 19A-B shows pump-power-dependent wide-field photoluminescence profiles in MAPbI$_3$(Cl) films, excited at the two different spots from FIG. 18. The curves in (B) correspond to fluence-normalized, integrated photoluminescence intensity profiles delimited by the rectangles in (A). Results show a small, ~10% variation of carrier population distribution on average despite a 30-fold reduction in peak fluence. Lower excitation powers display slightly broader distribution profiles, likely an indication that slightly fewer carrier-carrier scattering events impede diffusion at early times in the low-fluence measurements. The small deviation confirms that high-order recombination terms do not contribute substantially to the stroboSCAT measurements at the fluences used, and thus that the measurements are performed within a linear excitation regime.

The $MAPbI_3$(Cl) film thickness is 300 nm as measured by AFM. GBs are assumed to lie approximately perpendicular to the substrate plane. The films are assumed to be 1 grain thick (i.e., no GBs parallel to the substrate plane), as illustrated in FIG. 21C. These assumptions are reasonable based on cross-sectional SEM measurements taken on $MAPbI_3$(Cl) films prepared using the same protocol. The GBs are simulated as 200 nm thick, which accounts for slightly diagonal orientations of the GBs. 200 nm was chosen based on confocal fluorescence microscopy measurements that show occasionally completely dark GBs even though the image is convolved with a ~200-300 nm point spread function, implying that the effect of GBs is felt over a >150 nm region despite the fact that they may be far thinner. For simulations with correlated structural measurements, slight adjustments to the GB thickness are made in the simulation if they are determined to be larger than the diffraction limit in the confocal measurement. Von Neumann boundary conditions are assumed at all film edges, though the proportion of carriers reaching the lateral edges are negligible over the simulation time. Interparticle interactions are ignored, supported by the fluence-dependent measurements shown in FIG. 19. A first-order rate constant for recombination is included. The starting condition is an injected carrier density profile from the pump with a FWHM of 306 nm and exponentially decaying as a function of depth with a 1/e penetration depth of 60 nm.

The key simulation parameters are shown in FIG. 3. First, the GBs are assumed to have depth-dependent resistive properties. This assumption is based on conductive-probe AFM measurements that show that the surface of GBs in $MAPbI_3$ films are infinitely resistive, but that carriers do cross grain boundaries, leading to the postulate that the resistivity of GBs decreases as a function of depth. While the depth-dependent resistive profiles can adopt many forms, and may be GB-dependent and film-dependent, the simple form shown in FIG. 3A was adopted: an infinitely-resistive surface as previously measured using AFM, with a rapid drop-off to a value similar to the bulk resistivity. Note that the value that is varied in the simulations is the diffusion coefficient, related to resistivity p through the Einstein equation, $D=kT/(q^2Np)$, for charge q and charge number density N. The simulations qualitatively reproduce the data over a wide range of drop-off rate and final value for the diffusivity, but the onset of the drop-off is well-constrained: carriers need to pass through the GB in the region of 40-80 nm below the surface to reproduce the signals observed.

Second, the recombination rate at the top and bottom surface of the films are assumed to be 10 times larger than in the bulk, based on multiple studies showing that surface recombination dictates carrier lifetimes in $MAPbI_3$ perovskites. The recombination rate profile shown in FIG. 3B is determined based on the knowledge that surface contributions dominate photoluminescence decay with 400 nm excitation (~40-60 nm penetration depth). The simulation reproduces the experimental results over a wide range of parameters for the recombination rate profile vs depth.

Figure 4A:
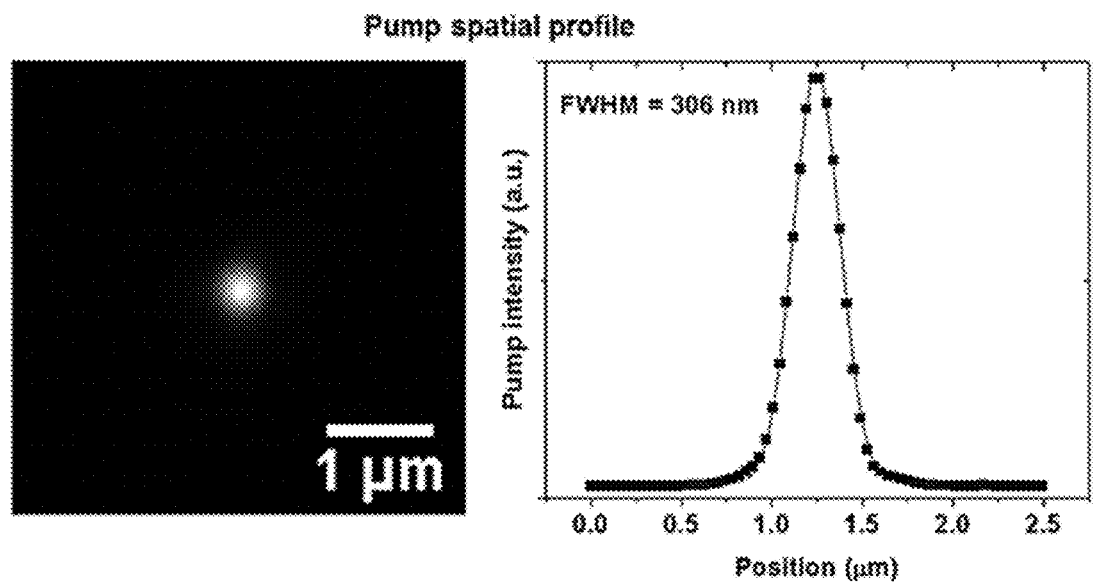
FIG. 4A-C provides for the current system resolution. (A) (Left-top): pump reflection from a glass substrate imaged on the CMOS camera, exhibiting a Gaussian profile with a FWHM of 306 nm (Right-top). (B) Wide-field probe PSF imaged using a 40 nm gold nanoparticle. The central part of the PSF corresponds closely to the expected diffraction-limited Gaussian. (C) Gaussian peak amplitude as a function of pump-probe time delay at early times for a stroboSCAT experiment on TIPS-Pentacene. The instrument response function of the system is estimated to be ~240 ps.
Figure 4B:
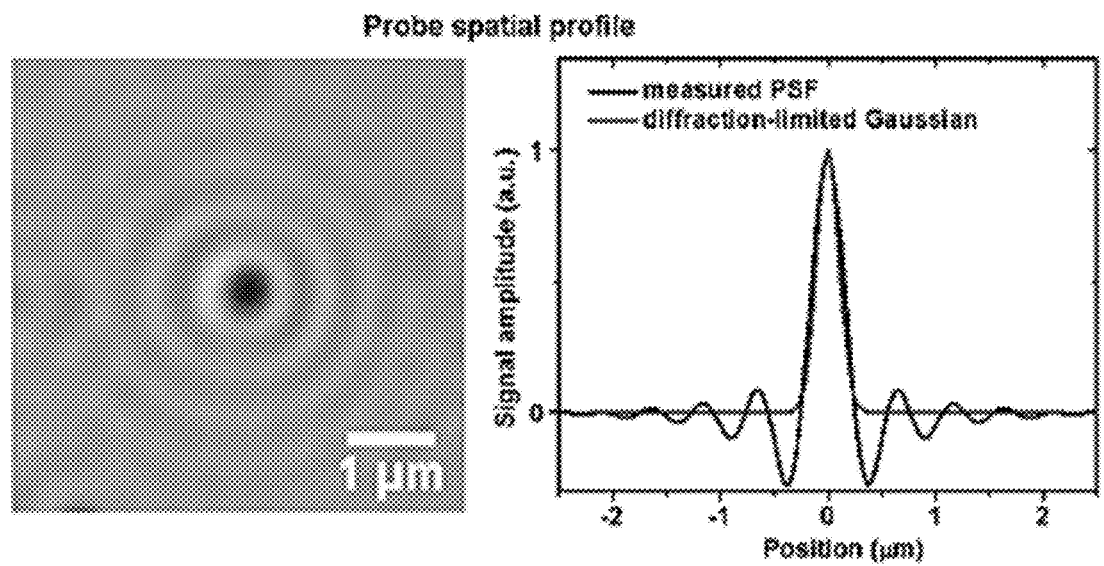
Figure 4C:
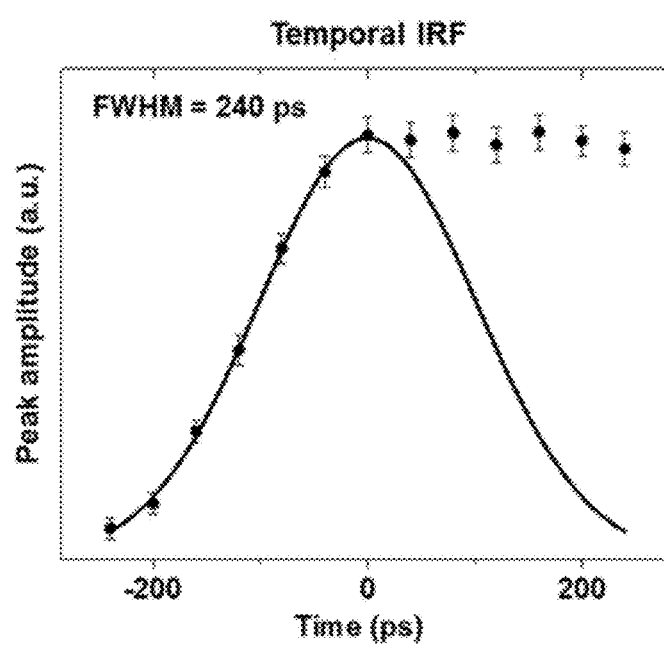

After simulation carrier diffusion, the stroboSCAT contrast is reproduced by applying a contrast scaling term based on the phase sensitivity of iSCAT. A π phase shift, which occurs every $\lambda/4\eta=60$ nm, corresponds to a contrast flip from negative to positive. To account for the finite probe penetration depth of d=67 nm, and the fact that probe photons that reach the detector upon scattering at a sample depth z pass through 2z of the material, the simulated incident probe light was attenuated using a damped cosine function $-\cos(\Delta\phi)*e^{-2z/d}$, where $\Delta\phi$ is the phase shift $\Delta\phi=4\pi\eta z/\lambda$. The negative sign accounts for the fact that the phase at the surface is $-\pi$ due to the Gouy phase. Finally, once this scaling is applied, the contrast is integrated across the depth of the film to simulate the stroboSCAT signal, which is then convolved with the probe PSF (FIG. 4B).

Figure 8:
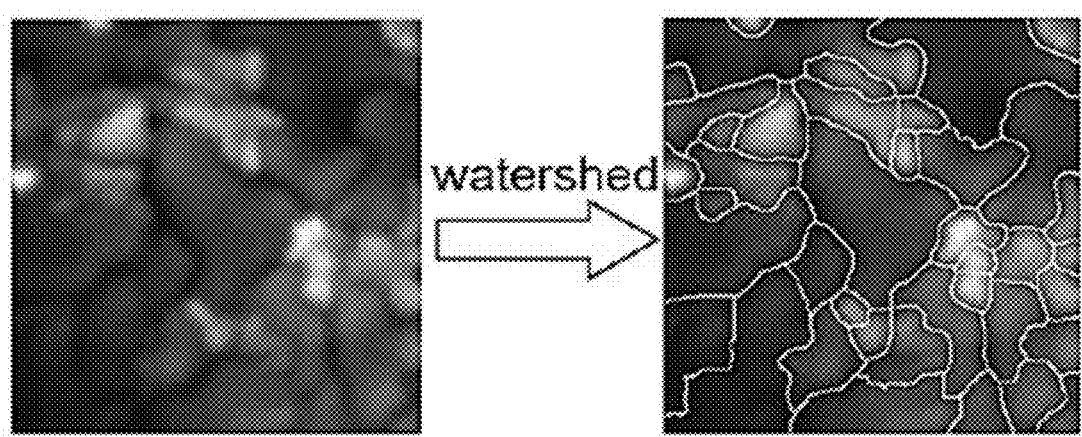
FIG. 8 presents regions in a $MAPbI_3(Cl)$ film used for structurally-correlated stroboSCAT measurements. A watershed algorithm is used to identify the position of grain boundaries. Grain boundaries in these films are dark in confocal emission microscopy. Surface cracks would not give rise to large contrast changes in confocal emission unless they extend to depths comparable to or greater than the microscope's depth of focus, ~150-200 nm.
Figure 9:
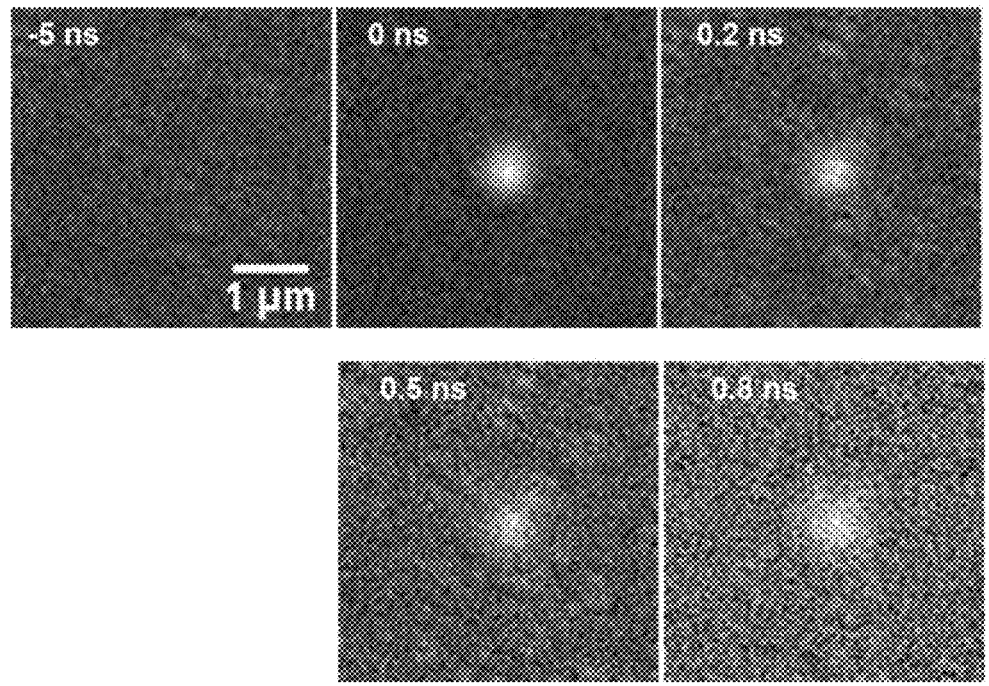
FIG. 9 provides a stroboSCAT time series on a $MAPbBr_3$ polycrystalline film. Note that background contributions due to sample vibrations/drift during acquisition are larger for heterogeneous samples than for samples that scatter homogeneously. The extracted diffusivity from this dataset is 0.15±0.02 cm$^2$/s. The average and standard deviation across 5 datasets are 0.16±0.05 cm$^2$/s. Fluence is 10 µJ/cm$^2$ (n$_o$2× 10$^{18}$ cm$^{-3}$). The pump at 440 nm is above bandgap, while the probe at 640 nm is non-resonant with both ground and excited state absorption.
Figure 10:
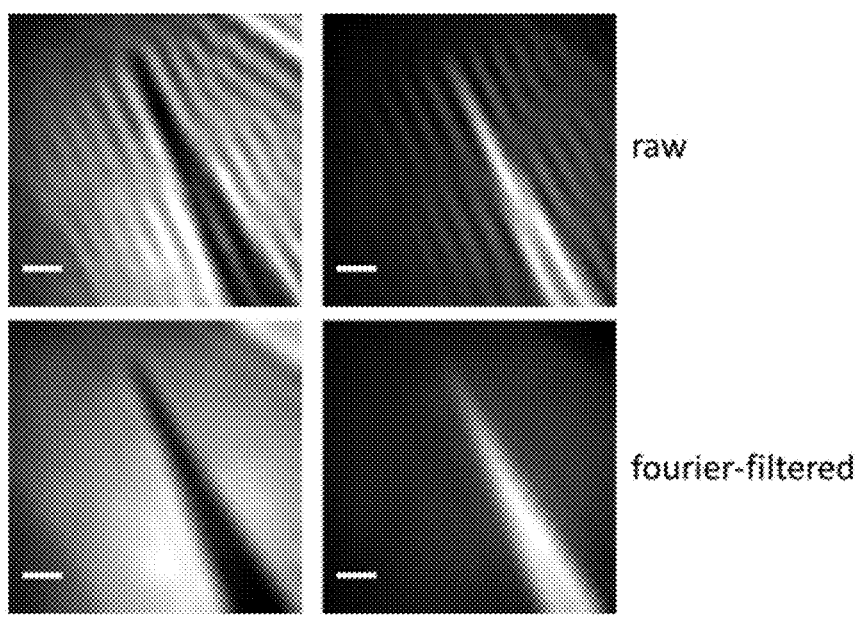
FIG. 10 presents iSCAT images of TIPS-pentacene crystalline domains shown in FIG. 20B, which are Fourier bandpass filtered to remove stripes from probe light diffraction off of interfaces in the sample, a consequence of using widefield illumination. The raw images are shown here at the top. Scale bars are 1 µm.
Figure 12:
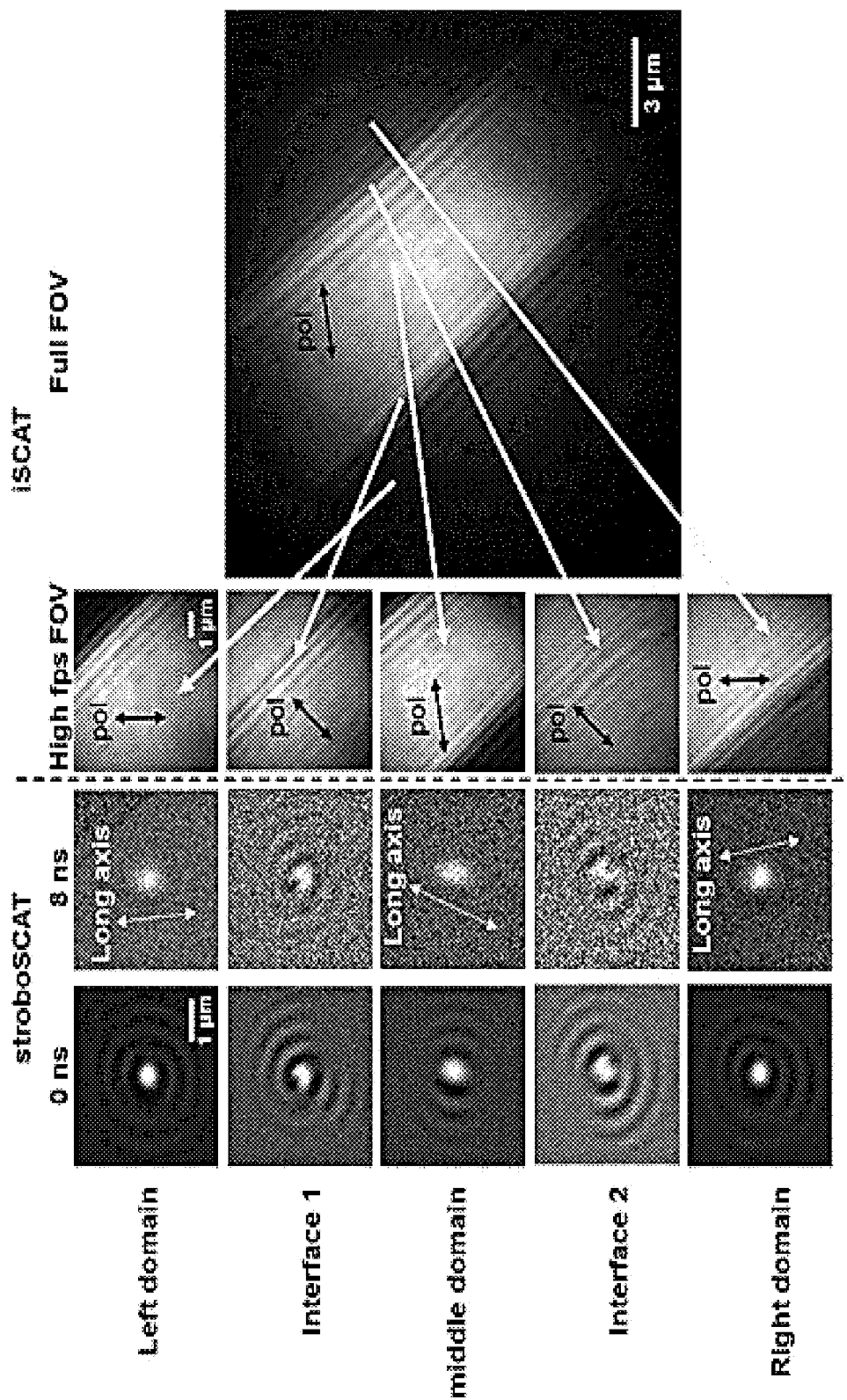
FIG. 12 provides additional datasets on TIPS-Pentacene in three crystalline domains and at two GBs. stroboSCAT images are shown on the left at 0 and 8 ns time delays. In the middle column, corresponding iSCAT (pump OFF) images at the probe polarizations used for each dataset are shown. On the right, a larger field-of-view image is used to capture the three domains in a single image at a given polarization—note that the contrast for each crystalline domain in iSCAT (pump OFF) images switches between bright and dark depending on the probe polarization used. The middle grain appears somewhat out-of-plane (i.e., the c-axis is not perpendicular to the substrate plane), as evidenced by a non-circular profile of the excitation spot at 0 ns in the stroboSCAT image, which we attribute to projection distortion. This non-planar orientation of the crystalline domain was observed in around 20% of the domains investigated in these films. For these datasets and those shown in the text, the pump was circularly polarized. When investigating GBs, the probe polarization is set to equalize contrast across grains, as shown explicitly in the iSCAT images above. The validity of this approach was tested by verifying that similar results were obtained with a circularly-polarized probe both in grains and at GBs, although the signal-to-noise ratio was poorer when using a circularly polarized instead of linearly polarized probe beam.

To confirm that tracing carriers in 3D using stroboSCAT provides structural information, measurements on a well-defined region in a $MAPbI_3$(Cl) film with grains that are clearly visible and separated in confocal fluorescence microscopy was performed. The use of an optical method (rather than AFM or SEM) for structural correlation is necessary as the films need to be imaged on the same side as the probe is incident, i.e., through the sample substrate, and in air- and moisture-free conditions. FIG. 8 shows the region used for correlated measurements, with a well-defined central grain. A watershed algorithm in imageJ is used to delimit the location of GBs.

Figure 23A:
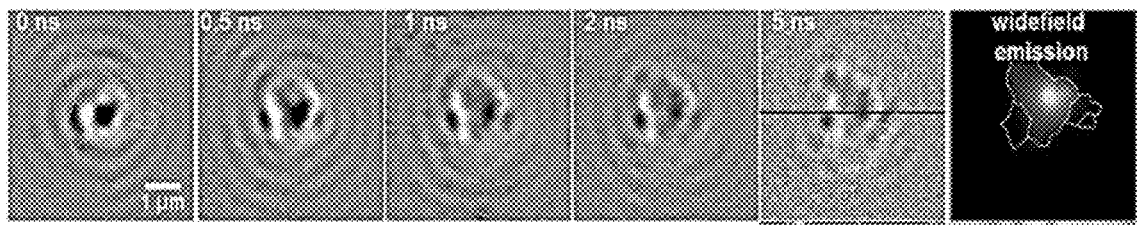
FIG. 23A-C shows structurally-correlated stroboSCAT-confocal fluorescence measurements. (A) stroboSCAT time series with correlated wide-field emission from confocal excitation. The overlaid curves show the 4 most relevant grains taken from FIG. 8. (B) Correlated scanning-beam confocal fluorescence and elastic scattering at 635 nm. (C) Experimental and simulated stroboSCAT data for different time delays through the line cut indicated by the horizontal line in (A; 5 ns panel) and (B). The simulations use the GB positions through the line determined from the confocal image in (B).
Figure 23B:
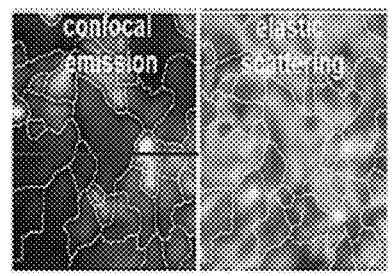

FIG. 23A shows the stroboSCAT data when exciting the large central grain. By overlaying the GB positions determined from confocal microscopy on the 0 ns and 5 ns frames, it is clear that the positive (light) contrast in stroboSCAT arises at the GB locations. The same picture as that described in FIG. 21: as carriers approach GBs, the stroboSCAT contrast flips from negative to positive, indicating that carriers pass GBs only at locations below the film surface. Once carriers have crossed GBs, they again freely move in 3 dimensions within grains, thus restoring the negative contrast. Since the stroboSCAT signal is strongest near the illuminated surface (FIG. 3C), where the contrast is negative, stroboSCAT gives rise to negative contrast within grains and positive contrast at GBs, clearly delineating the structure of these polycrystalline films.

Figure 21D:
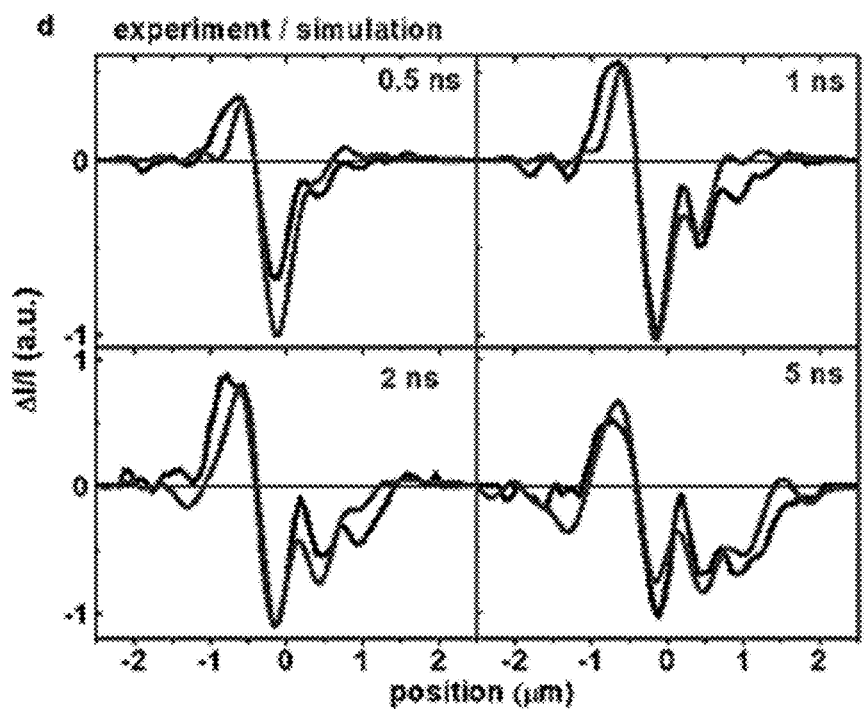
Figure 23C:
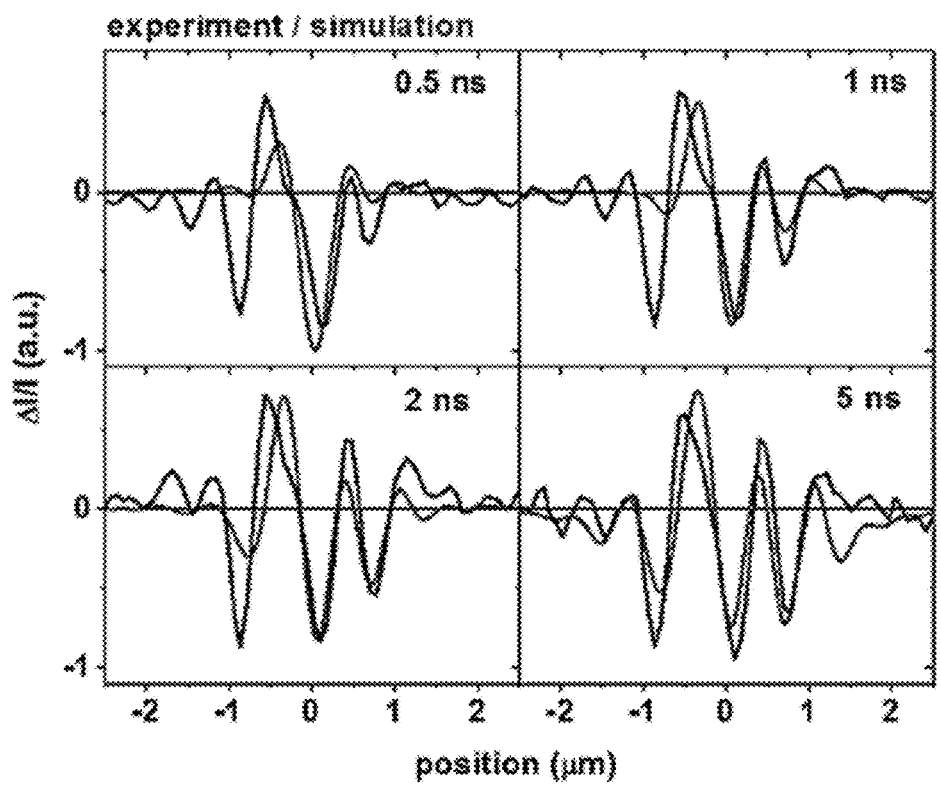

These deductions are confirmed with the finite element diffusion simulations shown in FIG. 23C and FIG. 21D, which reproduce the signal almost quantitatively despite using a relatively simple model. In the simulations shown in FIG. 23C, the positions of the GBs are constrained to those determined in confocal microscopy.

To further illustrate the rich information available from stroboSCAT measurements, as well as to gain a more generalized understanding of the influence of structural heterogeneity on energy transport, a set of analyses were developed that systematically quantified the degree of functional spatiotemporal heterogeneity in any sample. FIG. 22A plots the angle-resolved charge carrier lateral diffusivity for MAPbI$_3$ prepared with the PbCl$_2$ precursor, averaged over the first 2 ns of evolution, which ranges from 0.1 cm$^2$/s to 1.1 cm$^2$/s. The time dependence of lateral carrier motion along the 4 color-coded directions in FIG. 22A is depicted in FIG. 22B. The terracing observed in the time dependence illustrates how GB encounters appear to temporarily stop lateral energy flow, while intra-grain transport can be as high as 1.3 cm$^2$/s. Strikingly, the final plateau in population expansion occurs within several ns, indicating that carrier trapping occurs on time scales much shorter than the average carrier recombination time (430 ns). This termination of diffusion was observed across all measured areas, with the largest trapping time being 30 ns. This feature of the analysis emphasized the importance of tracking carriers until diffusion terminates, rather than assuming constant diffusion over the carrier lifetimes based on initial diffusivity, which would falsely imply an average diffusion length in this sample of ~10 µm instead of ~1 µm. Extreme caution was thus warranted when relating diffusivities with diffusion lengths obtained via bulk or temporally-averaged measurements. FIG. 22C compared the fastest and longest carrier transport pathway in each of the three perovskite samples. In the PbI$_2$ precursor film (red), transport was slow before a fraction of carriers found a way to cross into a larger grain, where weaker confinement by GBs permits diffusivities approaching the average intra-grain diffusivity in PbCl$_2$ precursor films. At longer times the trace flattens out, indicating the carrier population has now diffused throughout the larger grain and the diffusive driving force is too low to drive carrier crossing into other neighboring grains. In the PbAc$_2$ precursor film (black) the diffusion appeared to proceed at a constant, slow rate that represented an average of intra- and inter-grain transport due to the small grain size. The variation among and within different samples was summarized in FIG. 22D by plotting the distribution of diffusivities originating from a point along 20 different azimuthal directions for each precursor dataset. Clearly, the distribution of diffusivities was narrowest when grain sizes are small, progressively broadening and shifting to larger values as grain size increased. It was learnt from a similar analysis for exciton diffusion in TIPS-Pn (see FIG. 22F), where intra-grain transport was homogeneous while transport within GBs varied greatly, the large degree of heterogeneity for large-grain samples can be primarily attributed to the large variability of GB conductance across different GBs combined with the low GB-encounter rate.

A number of embodiments have been described herein. Nevertheless, it will be understood that various modifications may be made without departing from the spirit and scope of this disclosure. Accordingly, other embodiments are within the scope of the following claims.

What is claimed is:

1. A stroboscopic universal structure-energy flow correlation scattering microscopy system that optically tracks an energy carrier as it moves through an electronic material by using optical elastic scattering, wherein the system comprises:
    a laser pump;
    a wide-field laser probe;
    an objective lens; and
    a light detector,
wherein the laser pump is used to generate a localized population of energetic carriers in the electronic material, and wherein the wide-field laser probe is used to interrogate the change in the spatio-temporal-energetic scattering profile of the material induced by the laser pump.

2. The microscopy system of claim 1, wherein the system further comprises:
    one or more spatial filters;
    one or more optical filters;
    an aperture, and
    a spectrometer.

3. The microscopy system of claim 1, wherein the light pulse delay between the laser pump and the wide-field laser probe is arbitrarily controlled electronically from negative milliseconds to positive milliseconds with picosecond precision.

4. The microscopy system of claim 1, wherein the light pulse delay between the laser pump and the wide-field laser probe is arbitrarily controlled mechanically from negative nanoseconds to positive nanoseconds with femtosecond precision.

5. The microscopy system of claim 1, wherein the laser pump and the wide-field laser probe provide light pulses at different wavelengths across the ultraviolet, visible or infrared range of the electromagnetic spectrum.

6. The microscopy system of claim 1, where the light detector is an array camera.

7. The microscopy system of claim 6, wherein the array camera is a CMOS or CCD camera.

8. The microscopy system of claim 1, wherein the electronic material is a light-absorbing material that absorbs light at a wavelength of the laser pump.

9. The microscopy system of claim 8, wherein the light-absorbing material is a semiconductor material, a lead halide perovskite material, a silicon material, an acene derivative material, a polymer material, a 2D or 3D transition metal dichalcogenides material, a semimetal material, a graphene material, and/or a metal.

10. The microscopy system of claim 9, wherein the semiconductor material comprises MAPbAc$_2$, MAPbI$_2$, MAPbCl$_2$, MAPbBr$_3$, CsPbBr$_3$, and TIPS-pentacene.

11. The microscopy system of claim 8, wherein the light-absorbing material is a light-triggered biological sample.

12. The microscopy system of claim 11, wherein the light-triggered biological sample is a photosynthetic organism or an opto-genetically modified neuron.

13. The microscopy system of claim 8, wherein the material is an ionic material, a polymer material or polymer electrolyte for a battery.

14. The microscopy system of claim 1, wherein the system has one or more the following features:
    provides non-invasive contactless probing of opaque or transparent electronic materials;
    provides three dimensional spatial sensitivities;
    provides simultaneous spatio-temporal and spectral resolution of moving energy carriers; and/or employs millisecond acquisition time for any given laser pump-probe time delay.

15. A method to measure energy flow in an electronic material comprising:
    measuring the energy flow of an electronic material using the microscopy system of claim 1.

* * * * *